(12) United States Patent
Kato et al.

(10) Patent No.: US 11,705,419 B2
(45) Date of Patent: Jul. 18, 2023

(54) PACKAGING STRUCTURE FOR BIPOLAR TRANSISTOR WITH CONSTRICTED BUMPS

(71) Applicant: FUJI ELECTRIC CO., LTD., Kawasaki (JP)

(72) Inventors: Ryoichi Kato, Kawasaki (JP); Yoshinari Ikeda, Kawasaki (JP); Tatsuo Nishizawa, Kawasaki (JP); Eiji Mochizuki, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/139,065

(22) Filed: Dec. 31, 2020

(65) Prior Publication Data
US 2021/0242156 A1    Aug. 5, 2021

(30) Foreign Application Priority Data
Feb. 5, 2020    (JP) .................... 2020-017650

(51) Int. Cl.
*H01L 21/768* (2006.01)
*H01L 23/522* (2006.01)
(Continued)

(52) U.S. Cl.
CPC .............. *H01L 24/14* (2013.01); *H01L 21/50* (2013.01); *H01L 23/5385* (2013.01);
(Continued)

(58) Field of Classification Search
CPC ......... H01L 23/49541; H01L 23/49575; H01L 23/49582; H01L 24/05; H01L 24/30; H01L 24/45; H01L 24/73; H01L 2224/30181; H01L 2224/16058; H01L 24/16–17; H01L 23/367–3675; H01L 25/072;
(Continued)

(56) References Cited

U.S. PATENT DOCUMENTS 5,284,796 A    2/1994  Nakanishi et al.
9,576,932 B2 *  2/2017  Williams ................ H01L 24/37
(Continued)

FOREIGN PATENT DOCUMENTS

JP    S61156745 A    7/1986
JP    02235352 A     9/1990
(Continued)

*Primary Examiner* — Marcos D. Pizarro
*Assistant Examiner* — Tenley H Schofield
(74) *Attorney, Agent, or Firm* — Rabin & Berdo, P.C.

(57) ABSTRACT

A semiconductor module includes a laminated substrate having an insulating plate, a circuit pattern arranged on an upper surface of the insulating plate and a heat dissipating plate arranged on a lower surface of the insulating plate. The semiconductor module also includes a semiconductor device having a collector electrode arranged on its upper surface, having an emitter electrode and a gate electrode arranged on its lower surface, and bumps respectively bonding the emitter electrode and the gate electrode to an upper surface of the circuit pattern. Each of the bumps is made of a metal sintered material such that the bump is formed to be constricted in its middle portion in a thickness direction orthogonal to a surface of the insulating plate.

13 Claims, 11 Drawing Sheets

(51) Int. Cl.
*H01L 27/088* (2006.01)
*H10B 41/27* (2023.01)
*H10B 43/27* (2023.01)
*H01L 23/00* (2006.01)
*H01L 23/538* (2006.01)
*H01L 29/739* (2006.01)
*H01L 21/50* (2006.01)
*H01L 21/60* (2006.01)

(52) U.S. Cl.
CPC .......... *H01L 23/5386* (2013.01); *H01L 24/95* (2013.01); *H01L 29/7393* (2013.01); *H01L 2021/60022* (2013.01)

(58) Field of Classification Search
CPC ........... H01L 23/433; H01L 2924/1306; H01L 24/35; H01L 2924/01013; H01L 2224/05568; H01L 2924/01078; H01L 2924/13091; H01L 2224/40225; H01L 2224/05573; H01L 2924/16152; H01L 2924/19041
See application file for complete search history.

(56) References Cited

U.S. PATENT DOCUMENTS

| | | | |
|---|---|---|---|
| 2008/0224300 A1* | 9/2008 | Otremba | H01L 23/49582 257/693 |
| 2010/0093131 A1* | 4/2010 | Maeda | H01L 24/11 257/E21.705 |
| 2014/0159212 A1* | 6/2014 | Hung | H01L 23/3135 257/666 |
| 2015/0061116 A1* | 3/2015 | Lu | H01L 23/49811 257/737 |
| 2016/0365329 A1* | 12/2016 | Graf | H01L 24/16 |
| 2020/0135619 A1* | 4/2020 | Dinkel | H01L 24/33 |
| 2020/0243470 A1* | 7/2020 | Kato | H01L 24/13 |
| 2021/0050320 A1* | 2/2021 | Tsai | H01L 24/37 |
| 2021/0242103 A1* | 8/2021 | Kato | H01L 29/7393 |

FOREIGN PATENT DOCUMENTS

| | | |
|---|---|---|
| JP | H0567647 A | 3/1993 |
| JP | 2016025237 A | 2/2016 |

* cited by examiner

PACKAGING STRUCTURE FOR BIPOLAR TRANSISTOR WITH CONSTRICTED BUMPS

CROSS REFERENCE TO RELATED APPLICATIONS

This application is based upon and claims the benefit of priority of the prior Japanese Patent Application No. 2020-017650, filed on Feb. 5, 2020, the entire contents of which are incorporated herein by reference.

TECHNICAL FIELD

The present invention relates to a semiconductor module and a semiconductor module manufacturing method.

BACKGROUND ART

A semiconductor apparatus has a substrate produced with a semiconductor device such as an insulated gate bipolar transistor (IGBT), a power metal oxide semiconductor field effect transistor (MOSFET), or a free wheeling diode (FWD), and is used for an inverter device and the like.

For example, in Patent Literatures 1-3 presented below, a method for bonding a chip and a substrate in a semiconductor apparatus is disclosed. In the Patent Literatures 1-3, a chip is bonded to a substrate via bumps of solder or the like. Specifically, in the Patent Literature 1, solder bumps are arranged between a chip and a substrate; and by raising the chip upward while the solder bumps are melted in solder reflow, a chip bonding height with respect to the substrate is increased. In the Patent Literature 1, it is described that the more the bonding height becomes, the longer the bonding lasts. The solder bumps after bonding have a constricted shape at the center.

In the Patent Literature 2, solder bumps are arranged on respective corresponding positions of a semiconductor chip and a circuit board, to bond the solder each other. In addition, on the outside of the solder bumps, stud bumps for adjusting a bump height are arranged on a surface on a semiconductor device side. When the solder bumps melt, tip ends of the stud bumps contact a surface on a circuit board side, so that the bump height is adjusted. At this time, the solder bumps have a waist-like shape with a constricted center.

In the Patent Literature 3, spherical bumps containing a relatively easily plastically deformable metal, such as gold or aluminum, are used. The spherical bumps are bonded to a chip at their one end and are bonded to an insulating substrate at their other end; and after that, pressure is applied in a thickness direction, thereby adjusting its height.

CITATION LIST

Patent Literature

[Patent Literature 1] Japanese Patent Laid-Open No. 61-156745
[Patent Literature 2] Japanese Patent Laid-Open No. 5-67647
[Patent Literature 3] Japanese Patent Laid-Open No. 2016-25237

SUMMARY OF INVENTION

Problems to be Solved by the Invention

In a typical semiconductor module, a chip generates heat with a switching operation, causing thermal stress to be applied to its bonding portion; and as a result, a distortion may occur. In the above literatures (especially, Patent Literatures 1 and 2), by adjusting the bonding height of a bump to form a constricted shape at the center, concentration of stress is reduced and the reliability of the apparatus can be increased. However, a configuration and process for controlling the bump bonding height are complicated, which may cause an increase in cost.

An object of the present invention, which has been made in view of the above points, is to provide a semiconductor module and a semiconductor module manufacturing method that can increase the reliability of an apparatus by reducing a bump distortion due to thermal stress in a simple configuration.

Means for Solving the Problems

A semiconductor module in one aspect of the present invention is characterized by including: a laminated substrate including a circuit pattern arranged on an upper surface of an insulating plate and a heat dissipating plate arranged on a lower surface of the insulating plate; and a semiconductor device that has a collector electrode arranged on an upper surface thereof, has an emitter electrode and a gate electrode arranged on a lower surface thereof, and has the emitter electrode and the gate electrode each bonded to an upper surface of the circuit pattern via a bump. The bump is made of a metal sintered material such that the bump is formed into a shape of being constricted in its middle portion in comparison with a bonding portion.

A semiconductor module manufacturing method in one aspect of the present invention is a method for manufacturing a semiconductor module in which a semiconductor device is bonded to a laminated substrate including a circuit pattern arranged on an upper surface of an insulating plate and a heat dissipating plate arranged on a lower surface of the insulating plate; and is characterized by performing: a bump application step in which a bump made of a paste-like metal sintered material is applied to a bonding surface of the semiconductor device so that a tip end of the bump is formed into a tapered cone shape; and a bump bonding step in which bonding is performed by pressing the tip end of the bump against the circuit pattern so as to form a constricted portion in a middle portion of the bump.

Advantageous Effects of Invention

According to the present invention, a bump distortion due to thermal stress is reduced in a simple configuration, thereby allowing the reliability of the apparatus to be increased.

MODE FOR CARRYING OUT THE INVENTION

Figure 1:
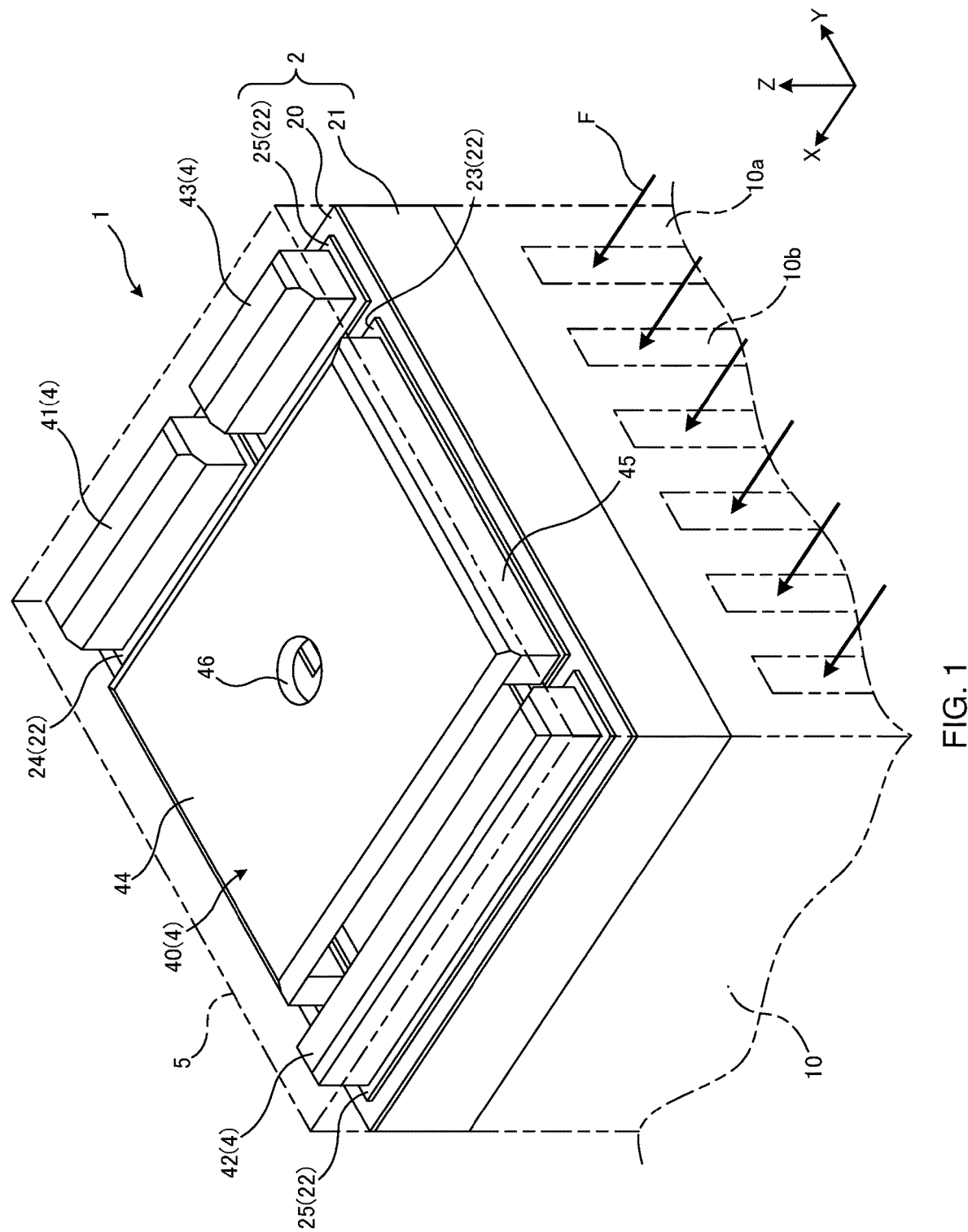
FIG. 1 is a perspective view of a semiconductor module according a present embodiment.
Figure 2:
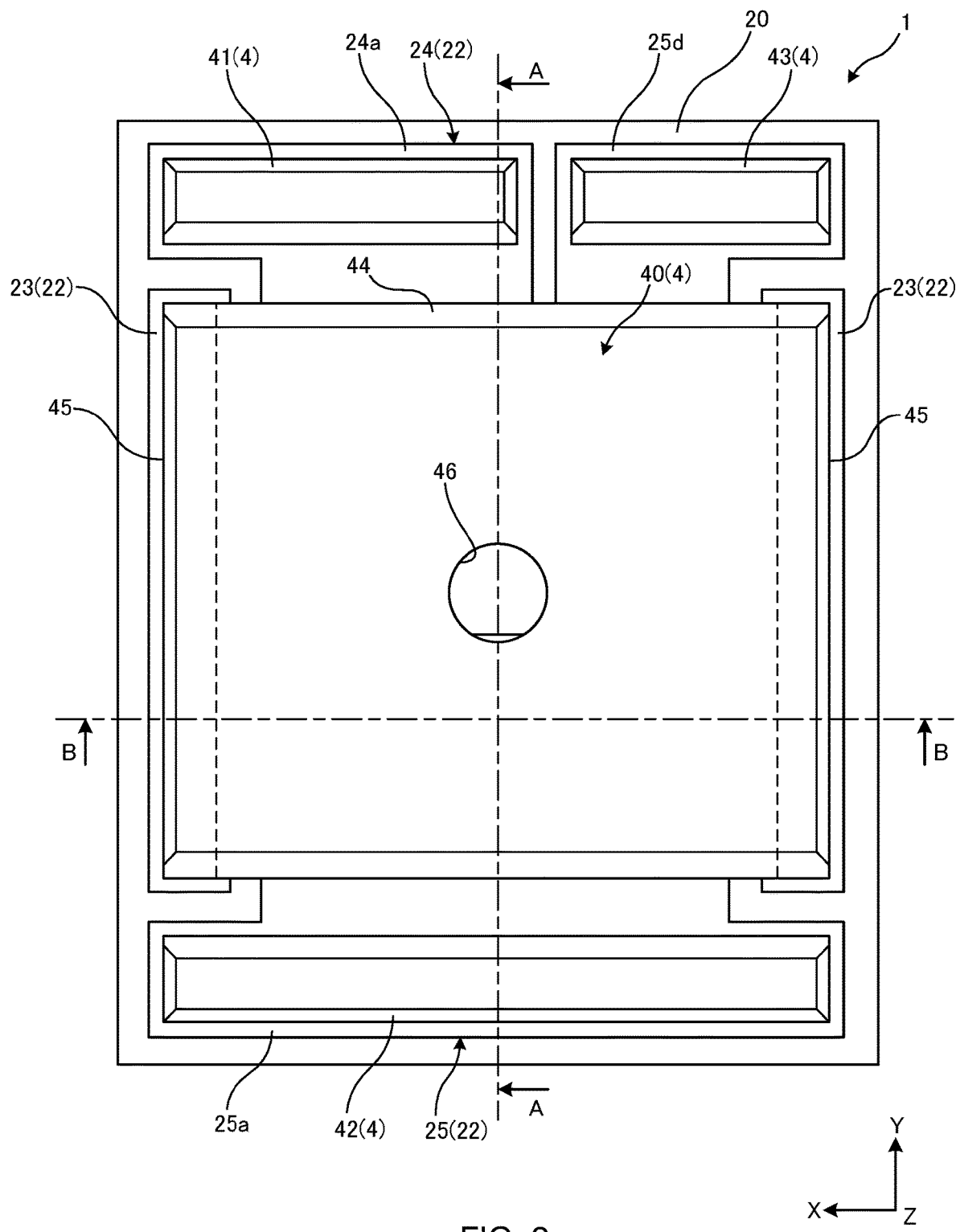
FIG. 2 is a plan view of the semiconductor module according the present embodiment.
Figure 3:
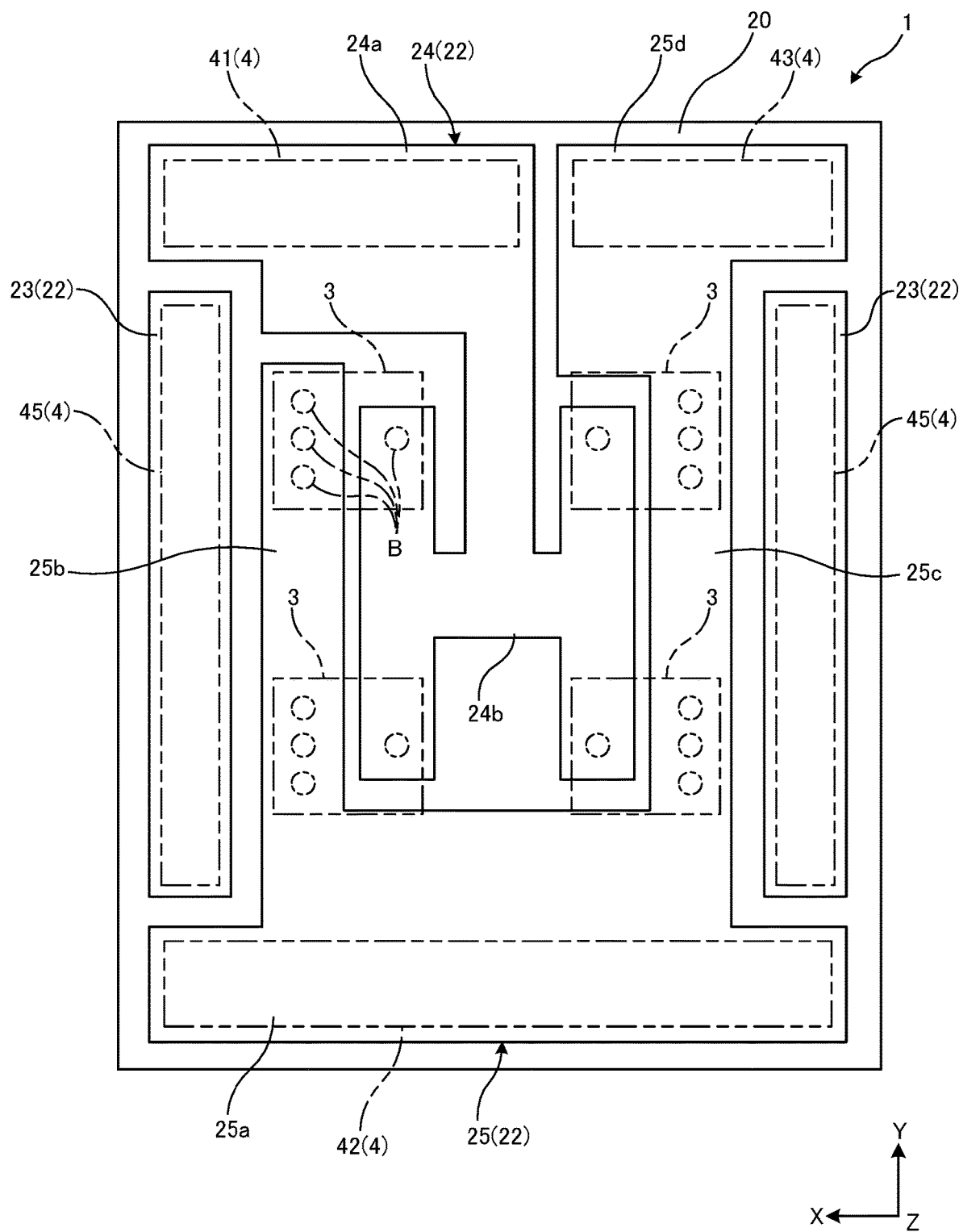
FIG. 3 is a plan view showing a circuit pattern of the semiconductor module according the present embodiment.
Figure 4A:
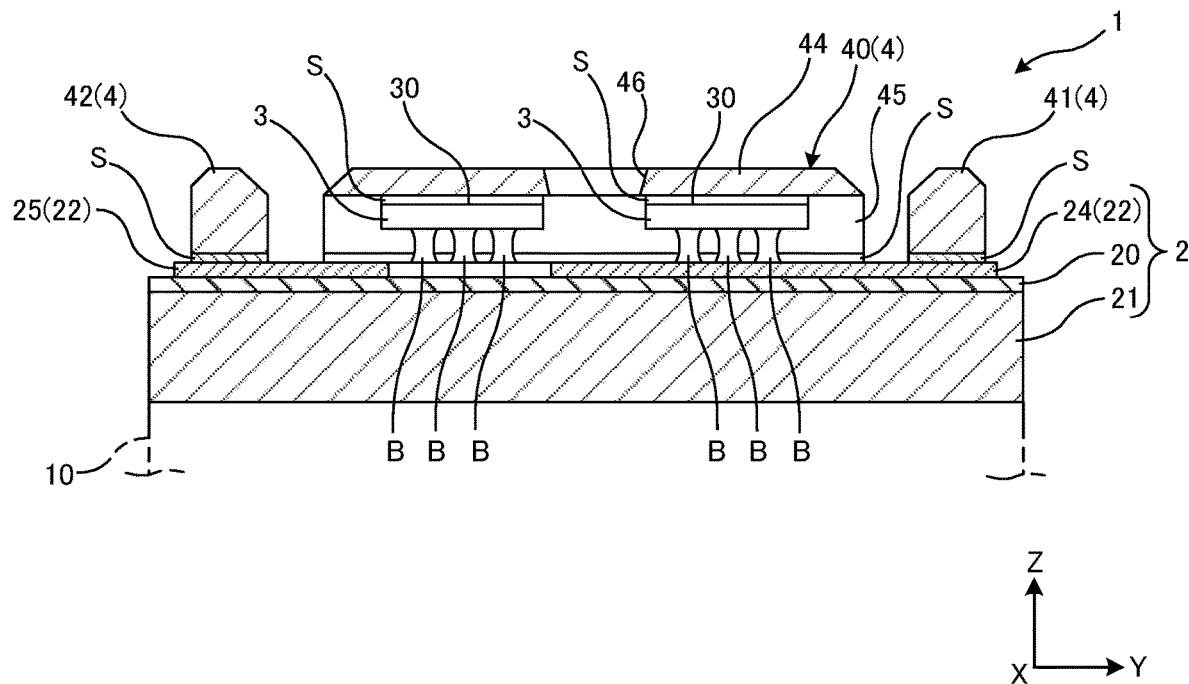
FIG. 4A and FIG. 4B are cross-sectional views of the semiconductor module according the present embodiment.
Figure 4B:
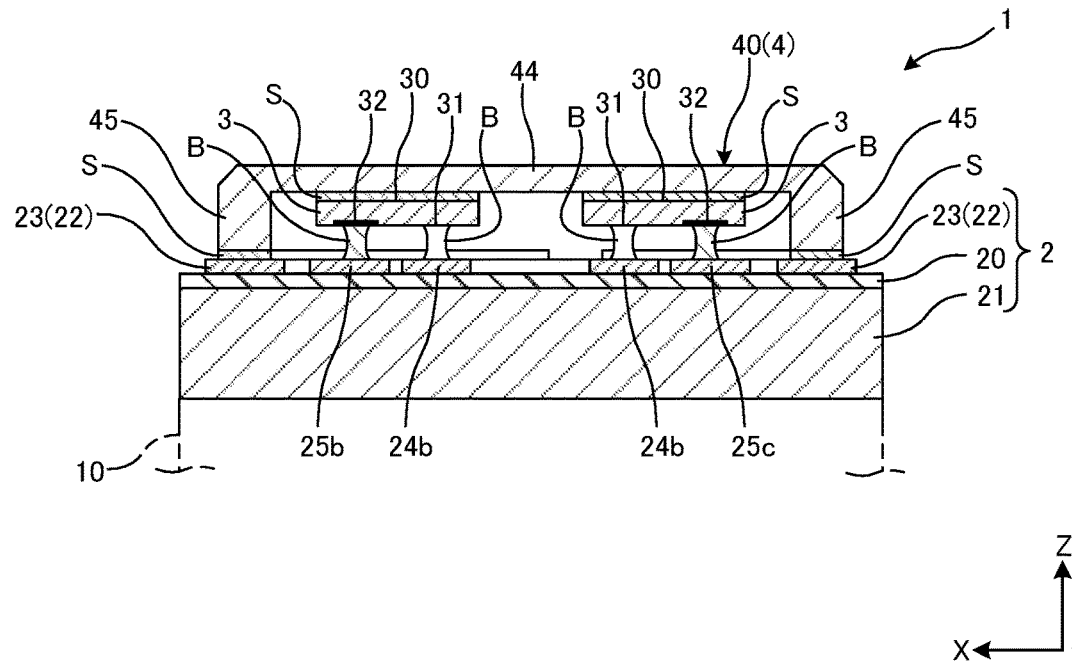
Figure 5A:
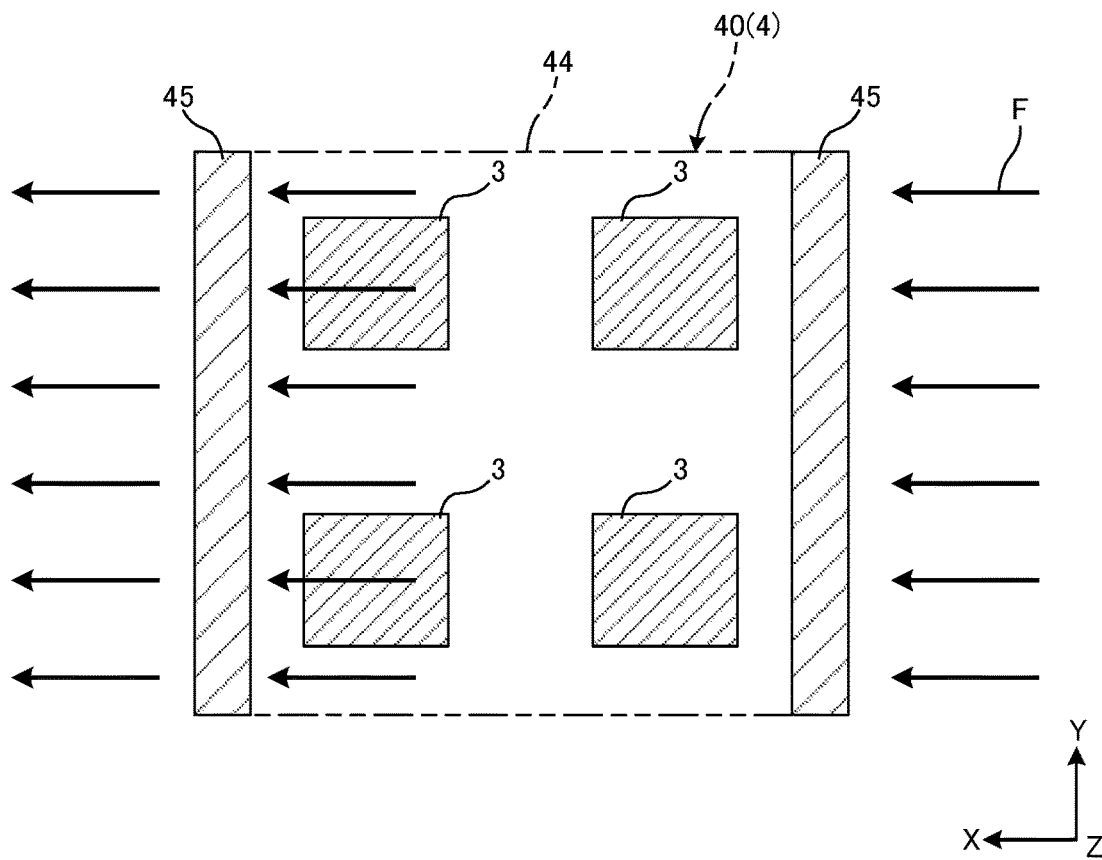
FIG. 5A and FIG. 5B are schematic views showing the flow of a coolant in the semiconductor module according the present embodiment.
Figure 5B:
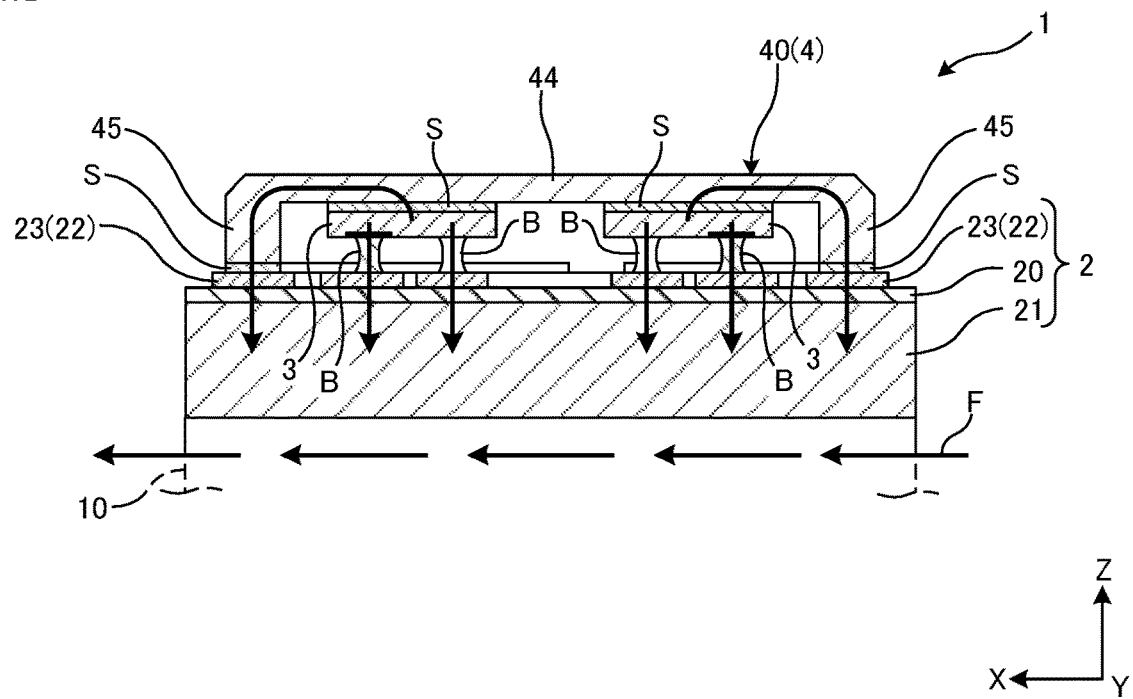

Hereinafter, a semiconductor module to which the present invention is applicable will be described. FIG. 1 is a perspective view of a semiconductor module according an embodiment. FIG. 2 is a plan view of the semiconductor module according the present embodiment. FIG. 3 is a plan view showing a circuit pattern of the semiconductor module according the present embodiment. FIG. 4 is cross-sectional views of the semiconductor module according the present embodiment. FIG. 4A is a cross-sectional view taken along line A-A in FIG. 2; and FIG. 4B is a cross-sectional view taken along line B-B in FIG. 2. FIG. 5 is a schematic view showing the flow of a coolant in the semiconductor module according the present embodiment. FIG. 5A is a schematic plan view of the semiconductor module; and FIG. 5B is a schematic cross-sectional view of the semiconductor module. Note that the semiconductor module presented below is merely an example and can be modified as appropriate without being limited thereto.

In addition, it is defined that in figures described below, a short direction of the semiconductor module is an X direction, a longitudinal direction is a Y direction, and a height direction is a Z direction. Furthermore, the X direction, the Y direction, and the Z direction may be referred to as a left-right direction, a front-back direction, and an up-down direction, respectively. These directions (front-back, left-right, and up-down directions) are terms used for convenience of explanation, and correspondence to each of the X, Y, and Z directions may change depending on the mounting position of the semiconductor module. For example, a heat dissipation surface side (cooler side) of the semiconductor module is considered as a lower surface side and its opposite side is referred to as an upper surface side. In addition, herein, a plan view refers to viewing an upper surface of the semiconductor module from the Z direction.

A semiconductor module 1 is applied, for example, to a power converter such as a power module. As shown in FIG. 1 to FIG. 4, the semiconductor module 1 is constituted by arranging a plurality of semiconductor devices 3 and a plurality of block electrodes 4 on an upper surface of a laminated substrate 2.

The laminated substrate 2 is formed by laminating a metal layer and an insulating layer and, for example, is constituted by a direct copper bonding (DCB) substrate, an active metal brazing (AMB) substrate, or a metal-based substrate. Specifically, the laminated substrate 2 includes: an insulating plate 20, a heat dissipating plate 21 arranged on a lower surface of the insulating plate 20; and a plurality of circuit patterns 22 arranged on an upper surface of the insulating plate 20. In addition, the laminated substrate 2 is formed into a rectangular shape in a plan view in which length in the Y direction is longer than in the X direction.

The insulating plate 20 has a thickness in the Z direction and is formed into a flat-plate shape having an upper surface and a lower surface. The insulating plate 20 is formed of, for example, a ceramic material such as alumina ($Al_2O_3$), aluminum nitride (AlN), or silicon nitride ($Si_2N_4$), a resin material such as epoxy, or an insulating material such as an epoxy resin material using a ceramic material as a filler. Note that the insulating plate 20 may be referred to as an insulating layer or an insulating film.

The heat dissipating plate 21 has a predetermined thickness and is formed so as to cover the entire lower surface of the insulating plate 20. The heat dissipating plate 21 is made of a metal plate having good thermal conductivity, such as copper or aluminum, for example. The lower surface of the heat dissipating plate 21 is a heat dissipation surface, and on the heat dissipation surface, a cooler 10 is mounted.

The cooler 10 is constituted of, for example, a heat sink and has a rectangular shape in a plan view. The cooler 10 is made of metal such as copper or aluminum, or an alloy containing one or more of them; and on its surface, a plating treatment has been performed, for example. The cooler 10 is mounted on the semiconductor module 1 via, for example, a compound having good thermal conductivity between itself and the lower surface of the semiconductor module 1 (heat dissipating plate 21). An upper surface of the cooler 10 is a smooth bonding surface to which the lower surface of the semiconductor module 1 is bonded. On a side of the lower surface of the cooler, a plurality of fins 10a projecting in the Z direction are formed.

The plurality of fins 10a are arranged in a row at intervals in the Y direction. This forms a groove 10b between adjacent fins 10a. A coolant such as air flows through the groove 10b, thereby achieving cooling of the semiconductor module 1. Although the details will be described later, a direction in which the coolant flows (flow direction) is referred to as a cooling direction F. Note that the cooler 10 is not limited to the configuration described above and may be constituted by a water-cooling type cooler provided with a water jacket.

As shown in FIG. 3, a main surface of the insulating plate 20 has a plurality of (four, in the present embodiment) circuit patterns 22 insularly (in a mutually electrically insulating state) formed. The plurality of circuit patterns 22 include: a pair of collector circuit patterns 23 connected to a collector electrode 30 of each of the semiconductor devices 3 described later; a gate circuit pattern 24 connected to a gate electrode 31 thereof; and an emitter circuit pattern 25 connected to an emitter electrode 32 thereof.

The collector circuit patterns 23 each has a long shape in a plan view, extending in a longitudinal direction (Y direction) of the insulating plate 20 on an outer periphery side of the insulating plate 20. The pair of collector circuit patterns 23 is arranged so as to face each other in a short direction (X direction) of the insulating plate 20.

The gate circuit pattern 24 bends in an L shape from an end portion on one side in the longitudinal direction of the insulating plate 20 toward the center thereof and has a shape of being divided into four branches from the center of the insulating plate 20. Specifically, the gate circuit pattern 24 is constituted by connecting an L portion 24a of an L shape in a plan view and an H portion 24b of an H shape in a plan view. The L portion 24a extends in the X direction from one corner portion of the insulating plate 20, bends perpendicularly at an approximate middle portion in the X direction of the insulating plate 20, and extends to a midsection (center) of the insulating plate 20. The H portion 24b is formed by connecting midsections of a pair of long portions extending in the Y direction with a long portion extending in the X direction. The H portion 24b is arranged in the midsection of the insulating plate 20. The midsection of the H portion 24b and an end portion on a side of the midsection of the L portion 24a are connected. Note that although the details will be described later, the H portion 24b constitutes a region where the gate electrode 31 is bonded via a bump B, in a midsection of the insulating plate 20.

The emitter circuit pattern 25 is formed in an approximate U shape in a plan view so as to surround an outer periphery side of the H portion 24b. Specifically, the emitter circuit pattern 25 includes: an emitter portion 25a extending in the X direction along a short side on the other side in the longitudinal direction of the insulating plate 20; a pair of long portions 25b and 25c extending in the Y direction from the emitter portion 25a; and a sense emitter portion 25d connected to one of the long portion 25c.

The pair of long portions 25b and 25c is connected to the emitter portion 25a at their one ends, and sides of the other ends extend along the Y direction. The pair of long portions 25b and 25c is arranged so as to face each other so that they sandwich the H portion 24b in the X direction. The long portions 25b and 25c are arranged so as to be sandwiched between each of the collector circuit patterns 23 and the H portion 24b. The pair of collector circuit patterns 23, the pair of long portions 25b and 25c, and the pair of long portions of the H portion 24b extend in parallel in the Y direction. The sense emitter portion 25d is arranged on an opposite side of the emitter portion 25a so as to sandwich one of the collector circuit patterns 23 with the emitter portion 25a. In addition, the sense emitter portion 25d is arranged side by side with the L portion 24a of the gate circuit pattern 24 in the X direction and extends in the X direction. The sense emitter portion 25d is connected to the one long portion 25c. Note that although the details will be described later, the emitter portion 25a constitutes a region where the emitter electrodes 32 are bonded via bumps B, outside the H portion 24b.

In the circuit patterns 22 thus configured, as shown in FIG. 3, the H portion 24b of the gate circuit pattern 24 is sandwiched between the pair of long portions 25b and 25c. In addition, the H portion 24b and the pair of long portions 25b and 25c are sandwiched between the pair of collector circuit patterns 23. Note that chain double-dashed line portions in FIG. 3 represent areas where the block electrodes 4 or semiconductor devices 3, which are described below, are bonded. These circuit patterns may be referred to as a circuit board.

At predetermined positions on the circuit patterns 22, a plurality of the semiconductor devices 3 are arranged. Each of the semiconductor devices 3 is formed into a square shape in a plan view by a semiconductor substrate such as silicon (Si) or silicon carbonate (SiC), for example. In the present embodiment, the semiconductor device 3 is constituted by a reverse-conducting-insulated gate bipolar transistor (RC-IGBT) device in which functions of an IGBT device and a free wheeling diode (FWD) device are integrated.

Note that the semiconductor device 3 is not limited to this and may be constituted by combining a switching device such as an IGBT or power metal oxide semiconductor field effect transistor (MOSFET) and a diode such as a free wheeling diode (FWD). In addition, a reverse blocking (RB)-IGBT or the like having a sufficient withstand voltage against a reverse bias may be used as the semiconductor device 3. Furthermore, the shape, number of arrangements, and arrangement positions of the semiconductor devices 3 can be changed as appropriate.

In the present embodiment, four semiconductor devices 3 are arranged, via a plurality of bumps B, on upper surfaces of the H portion 24b and the pair of long portions 25b and 25c. Specifically, the semiconductor devices 3 are arranged so as to straddle above ends of the branched H portion 24b and ends or base ends of the long portions 25b and 25c. On an upper surface of each of the semiconductor devices 3, the collector electrode 30 is arranged; and on a lower surface of each of the semiconductor devices 3, the gate electrode 31 and the emitter electrode 32 are arranged. In the center of one end side of the semiconductor device 3, the gate electrode 31 is arranged; and on another end side opposed thereto, the emitter electrode 32 is arranged.

The semiconductor device 3 is bonded to its corresponding circuit pattern 22 via bumps B by arranging the gate electrode 31 so as to face an upper surface of a corresponding end of the H portion 24b and arranging the emitter electrode 32 so as to face an upper surface of the long portion 25b or 25c. More specifically, the gate electrode 31 is electrically bonded to the upper surface of the corresponding end of the branched H portion 24b, via one bump B for each of the semiconductor devices 3. In addition, the emitter electrode 32 is electrically bonded to the upper surface of the long portion 25b or 25c via three bumps B for each of the semiconductor devices 3.

As described above, the gate electrode 31 and the emitter electrode 32 are arranged side by side in the X direction. Especially, the gate electrode 31 is arranged more inward in the X direction than the emitter electrode 32. That is, four gate electrodes 31 are arranged closer to a side of the center of the entire module than four emitter electrodes 32.

For the bumps B, a metal sintered material can be used. For example, a silver sintered material which is obtained by sintering of silver nanoparticle paste containing nanoparticles of metal such as silver can be used as the bumps B. Note that the bumps B may be composed of a metal sintered material obtained by sintering of metal nanoparticle paste containing nanoparticles of metal such as gold, silver, copper, aluminum, nickel, or the like, not limited to silver. The metal nanoparticle paste is formed by dispersing metal nanoparticles coated by an amine dispersed material into an organic solvent such as toluene, for example. The bumps B are formed in a columnar shape extending in a thickness direction (Z direction), for example. In addition, although the details will be described later, one end of each of the bumps B is bonded to the emitter electrode 32 or gate electrode 31 of the semiconductor device 3 and the other end is bonded to a corresponding circuit pattern 22. Furthermore, each of the bumps B has a drum shape with a middle portion in a height direction (Z direction) constricted.

In addition, to the circuit patterns 22, the block electrodes 4 are bonded. Specifically, the block electrodes 4 include: a collector electrode block 40 bonded to the collector circuit pattern 23; a gate electrode block 41 bonded to the gate circuit pattern 24; and an emitter electrode block 42 and a sense emitter electrode block 43 both bonded to the emitter circuit pattern 25.

The collector electrode block 40 is formed into an approximately square shape in a plan view so as to cover the most part above the laminated substrate 2. Specifically, the collector electrode block 40 includes: a flat plate portion 44 covering a part above the semiconductor devices 3; and a pair of projecting portions 45 projecting from both ends in the X direction of the flat plate portion 44 toward the collector circuit patterns 23. Thus, the collector electrode block 40 forms an approximate U shape when viewed from the Y direction.

The flat plate portion 44 is formed into an approximate square shape in a plan view so as to cover a part above: the pair of collector circuit patterns 23; the pair of long portions 25b and 25c and the H portion 24b which are arranged between the pair of collector circuit patterns 23; and the four semiconductor devices 3. The width in the X direction of the flat plate portion 44 corresponds to a facing distance of the pair of collector circuit patterns 23. The width in the Y direction of the flat plate portion 44 corresponds to the length in the Y direction of the collector circuit patterns 23. In addition, at the center of the flat plate portion 44, a circular through hole 46 that penetrates in the thickness direction is formed.

Each of the projecting portions 45 has an approximate rectangular cuboid shape that projects downward in the Z direction from each end portion in the X direction of the flat plate portion 44. The width in the X direction of the projecting portion 45 is slightly smaller than the width of the collector circuit patterns 23. In addition, the width in the Y direction of the projecting portions 45 corresponds to the width of the flat plate portion 44; and is slightly smaller than the width of the collector circuit pattern 23. Furthermore, at each corner portion on an upper surface side of the collector electrode block 40, a chamfer is formed. The pair of projecting portions 45 is arranged along two opposing sides of the insulating plate 20.

On a lower surface of the flat plate portion 44, the collector electrodes 30 of the semiconductor devices 3 are electrically bonded via a bonding material S. In addition, a lower surface of each of the projecting portions 45 is electrically bonded to each of the collector circuit patterns 23 via the bonding material S. As the bonding material S, a sheet-like metal sintered material can be used. For example, a silver sintered material which is obtained by sintering of a silver nanoparticle sheet containing nanoparticles of metal such as silver can be used as the bonding material S. Note that the bonding material S may be composed of a metal sintered material obtained by sintering of a metal nanoparticle sheet containing nanoparticles of other metal such as gold, silver, copper, aluminum, nickel, or the like, not limited to silver. The metal nanoparticle sheet is formed by bonding metal nanoparticles with an organic binder such as polyester. The bonding material S is formed into a rectangular shape with a predetermined thickness, for example. Note that the bonding material S may be constituted by solder, not limited to the metal sintered material. In addition, the bonding material S may be formed in a paste-like state, not limited to a sheet-like state. Furthermore, the height in the Z direction of the projecting portions 45 preferably corresponds to the height obtained by adding the thickness of the semiconductor devices 3 and the height of the bumps B.

The gate electrode block 41 has a rectangular cuboid shape which is longer in the X direction. Specifically, the width in the X direction of the gate electrode block 41 corresponds to the width of the long portion in the X direction of the L portion 24a. The width in the Y direction of the gate electrode block 41 is slightly smaller than the width of the L portion 24a. Furthermore, at each corner portion on the upper surface side of the collector electrode block 40, a chamfer is formed. A lower surface of the gate electrode block 41 is electrically bonded to an upper surface of the long portion in the X direction of the L portion 24a, via the bonding material S.

The emitter electrode block 42 has a rectangular cuboid shape extending in the X direction along the short side on the other side of the longitudinal direction of the insulating plate 20. Specifically, the widths in the X direction and Y direction of the emitter electrode block 42 are slightly smaller than the corresponding widths of the emitter portion 25a. In addition, at each corner portion on an upper surface side of the emitter electrode block 42, a chamfer is formed. A lower surface of the emitter electrode block 42 is electrically bonded to an upper surface of the emitter portion 25a via the bonding material S. The emitter electrode block 42 is arranged outside the collector electrode block 40 (flat plate portion 44) in a plan view.

The sense emitter electrode block 43 has a rectangular cuboid shape which is longer in the X direction. Specifically, the widths in the X direction and Y direction of the sense emitter electrode block 43 are slightly smaller than the corresponding widths of the sense emitter portion 25d. Furthermore, at each corner portion on the upper surface side of the collector electrode block 40, a chamfer is formed. A lower surface of the sense emitter electrode block 43 is electrically bonded to an upper surface of the sense emitter portion 25d via the bonding material S. The sense emitter electrode block 43 is arranged outside the collector electrode block 40 (flat plate portion 44) in a plan view. The sense emitter electrode block 43 is arranged side by side with the gate electrode block 41 in the X direction. In addition, the length in the X direction of the sense emitter electrode block 43 is shorter than the length of the gate electrode block 41.

The block electrodes 4 thus configured are set so as to have the same height in the Z direction. In addition, the block electrodes 4 are preferably made of a metal material having good thermal conductivity, such as copper or aluminum. Furthermore, the collector electrode block 40 may be formed so as to have the flat plate portion 44 and the pair of projecting portions 45 integrated; or may be formed by bonding the flat plate portion 44 and the pair of projecting portions 45 by welding or the like.

In addition, a space above the laminated substrate 2 is filled with a sealing resin 5 (see FIG. 1). The sealing resin 5 is filled, for example, from the through hole 46, to seal the semiconductor devices 3, the laminated substrate 2, and the block electrodes 4. As the sealing resin 5, an epoxy resin or silicone gel can be used.

In a conventional semiconductor module, a semiconductor device is arranged on an upper surface of a laminated substrate. An emitter electrode is arranged on an upper surface of the semiconductor device; and a collector electrode is arranged on a lower surface of the semiconductor device. An emitter electrode and a circuit pattern of the laminated substrate are electrically bonded by bonding wire, for example. In addition, a cooler is arranged on a lower surface of the laminated substrate.

In the conventional configuration, heat generated by the emitter electrode is discharged to the outside through the cooler. In this case, the emitter electrode is on a front surface side of the semiconductor device and therefore, the generated heat is transferred to a rear surface side (collector electrode side) of the semiconductor device and is discharged to the outside through the laminated substrate and the cooler.

As described above, the semiconductor device generates heat on a side of the emitter electrode and therefore, it is necessary to transfer the heat generated on the emitter electrode side to the collector electrode side that is a side of the cooler. This causes a problem in which the thermal resistance of the entire module is increased according to the thermal conductivity and thickness of the semiconductor device. In addition, there is another problem that, as described above, since wiring of the emitter electrode is conventionally performed by bonding wire, a wiring length has to be long and this results in an increase in inductance.

Then, the inventors have focused attention on the direction of an emitter electrode that is a heat generation source of a semiconductor device and have conceived the present invention. That is, the gist of the present invention is to reverse a bonding direction of the semiconductor devices 3 from the conventional one and arrange the emitter electrodes 32 so as to face a side of the laminated substrate 2. Specifically, in the present embodiment, the semiconductor devices 3 are arranged on an upper surface of the laminated substrate 2. On the upper surface of each of the semiconductor devices 3, the collector electrode 30 is arranged; and on a lower surface of the semiconductor device 3, the emitter electrode 32 is arranged. The emitter electrode 32 is bonded to a corresponding circuit pattern 22 on the laminated substrate 2 via bumps B.

In addition, to the collector electrode 30 on an upper surface side of the semiconductor device 3, the block electrode 4 (collector electrode block 40) is bonded. The collector electrode block 40 includes: the flat plate portion 44 covering a part above the semiconductor devices 3; and the projecting portions 45 projecting from both ends of the flat plate portion 44 toward corresponding circuit patterns 22. The projecting portions 45 are bonded to the circuit patterns 22.

According to this configuration, the emitter electrode 32 is faced to the laminated substrate 2 side and is bonded to the laminated substrate 2 via bumps B and therefore, heat generated by the emitter electrode 32 can be directly transferred to the laminated substrate 2 (heat dissipating plate 21) via the bumps B without going through an inside of the semiconductor device. This reduces a thermal resistance, thereby allowing a cooling efficiency to be enhanced. The reduction of the thermal resistance allows a module size to be brought close to a chip size, thereby achieving miniaturization of the entire module. In addition, the wiring of the emitter electrode 32 with bumps B can reduce the wiring length in comparison with conventional bonding wire and can also reduce inductance.

Furthermore, electrical connection of the collector electrodes 30 by the collector electrode block 40 eliminates unnecessary wiring and allows heat of the semiconductor devices 3 to be transferred to the laminated substrate 2 via the collector electrode block 40. That is, the collector electrode block 40 can be used as not only an electrical bonding material but also a heat transfer material. This allows the cooling efficiency to be further enhanced. Yet furthermore, a use of a lot of the metal block electrodes 4 having high heat capacity allows a module having high transient thermal characteristics and short-circuit withstanding capability to be provided.

In the present embodiment, a direction in which the pair of projecting portions 45 faces each other in the collector electrode block 40 preferably corresponds to a direction in which a coolant flows (cooling direction F) within a range corresponding to that of the collector electrode block 40 in the cooler 10 mounted on the lower surface of the semiconductor module 1. The direction in which the coolant flows may be, for example, in parallel with the grooves 10b in the cooler 10 which includes the plurality of fins 10a having the grooves 10b formed in one direction (X direction) as shown in FIG. 1. In addition, in the cooler 10 constituted by a water cooling jacket, for example, a direction in which a liquid flows within the water cooling jacket may correspond to a direction in which the pair of projecting portions 45 faces each other.

Specifically, as shown in FIG. 5A, the pair of projecting portions 45 each has a rectangular cuboid shape which is longer in the Y direction, and faces each other in the X direction. In this case, the direction in which the coolant flows in the cooler 10 (cooling direction F) is preferably toward the X direction. According to this configuration, as shown in FIG. 5B, the coolant flows from a part below one of the projecting portions 45 toward a part below the other of the projecting portions 45 through a part below the flat plate portion 44. The coolant thus flows in a direction perpendicular to a longitudinal direction (long side) of the projecting portions 45 and thereby the coolant in a wide range contributes to cooling the collector electrode block 40.

As shown in FIG. 5B, on a midstream side of the coolant (center side in the X direction of the semiconductor module 1), the heat of the semiconductor devices 3 can be discharged to a side of the cooler 10 via bumps B. In addition, on an upstream side and downstream side of the coolant (outsides in the X direction of the semiconductor module 1), the heat of the semiconductor devices 3 can be discharged to the cooler 10 side via the flat plate portion 44 and the pair of projecting portions 45. Thus, heat can be effectively discharged from both sides of the semiconductor devices 3. As a result, the four semiconductor devices 3 which are arranged between the pair of projecting portions 45 in a part below the flat plate portion 44 can be uniformly cooled. Thus, temperature variations for each of the semiconductor devices 3 can be prevented, thereby allowing an improvement in a cooling performance.

In addition, in the present embodiment, the through hole 46 penetrating in a thickness direction is formed in the center of the flat plate portion 44. According to this configuration, the through hole 46 can be used as an injection port for the sealing resin 5. This allows the sealing resin 5 to be uniformly filled with between the flat plate portion 44 and the semiconductor devices 3. Furthermore, voids formed when the sealing resin 5 is injected can be easily removed.

In addition, in the present embodiment, the gate electrodes 31 are arranged closer to a center side of the flat plate portion 44 than the emitter electrodes 32. That is, each of the gate electrodes 31 of the four semiconductor devices 3 is placed toward the center side of the flat plate portion 44 as shown in FIG. 3 and FIG. 4 and each of the emitter electrodes 32 is positioned on an outer peripheral side than the gate electrodes 31. More specifically, the four semiconductor devices 3 are provided in a 2×2 arrangement below the flat plate portion 44 in a plan view; and the gate electrodes 31 of the semiconductor devices 3 are arranged so as to face one another in the center of the flat plate portion 44. According to this configuration, the emitter electrodes 32 that are heat generation locations are not concentrated on the center side of the module and spacing between the emitter electrodes 32 is allowed. As a result, heat is dispersed without being concentrated on the center of the module, thereby, allowing cooling efficiency to be enhanced. Furthermore, each of the gate electrodes 31 is arranged on a center side of the laminated substrate 2 and is bonded to an upper surface of each of the ends of the branched H portion 24b via bumps B, which can make the wiring length from an outside to each of the gate electrodes 31 short and uniform and in addition, can prevent gate oscillation.

In addition, in the present embodiment, at an outside of the collector electrode block 40, the gate electrode block 41, the emitter electrode block 42, and the sense emitter electrode block 43 are arranged. That is, the collector electrode block 40 is arranged so as to be sandwiched between the gate electrode block 41, the emitter electrode block 42, and the sense emitter electrode block 43, in the Y direction. According to this configuration, the emitter electrode block 42 and the sense emitter electrode block 43 are arranged at the outside of the collector electrode block 40, thereby allowing external connection to be easily implemented.

Furthermore, in a typical semiconductor module, a chip generates heat with a switching operation, causing thermal stress to be applied to its bonding portion; and as a result, a distortion may occur. Therefore, in order to ensure the reliability of the apparatus, such a technique has been conventionally proposed that a center portion of a solder bump is constricted so as to be formed into a drum shape by adjusting the bonding height of a solder bump which bonds the chip and a substrate. According to this configuration, concentration of stress at the bonding portion can be prevented; however a configuration and process for controlling the bonding height of the solder bump are complicated, which may be a cause of an increase in the cost of the entire module.

Thus, the inventors have focused attention on a material of a bump and a forming method of the same, and have conceived the present invention. Specifically, in the present embodiment, the bump B composed of a metal sintered material has a column shape extending in the Z direction. An upper end of the bump B is bonded to one of the emitter electrodes 32 or the gate electrodes 31; and a lower end of the bump B is bonded to a corresponding circuit pattern 22 (long portion 25b or H portion 24b). Furthermore, the bump B has a shape of being constricted in its middle portion in comparison with a bonding portion to each of the electrodes of the semiconductor devices 3 or to the circuit pattern 22.

According to this configuration, the middle portion of the bump B is constricted and therefore, the vicinities of interfaces of the bonding portions of the bump B are wider than the middle portion, which allows bonding in a smooth outer shape. Consequently, concentration of thermal stress on the interface is prevented, thereby allowing a reduction in distortion of the bump B due to the thermal stress. For example, exfoliation and cracking on the interfaces (bonding surfaces) of the bump B can be prevented. In addition, although the details will be described later, since the bump B is composed of a metal sintered material, the above constricted shape can be formed without performing a complicated height control. Thus, the reliability of the apparatus can be increased in a simple configuration.

Figure 11A:
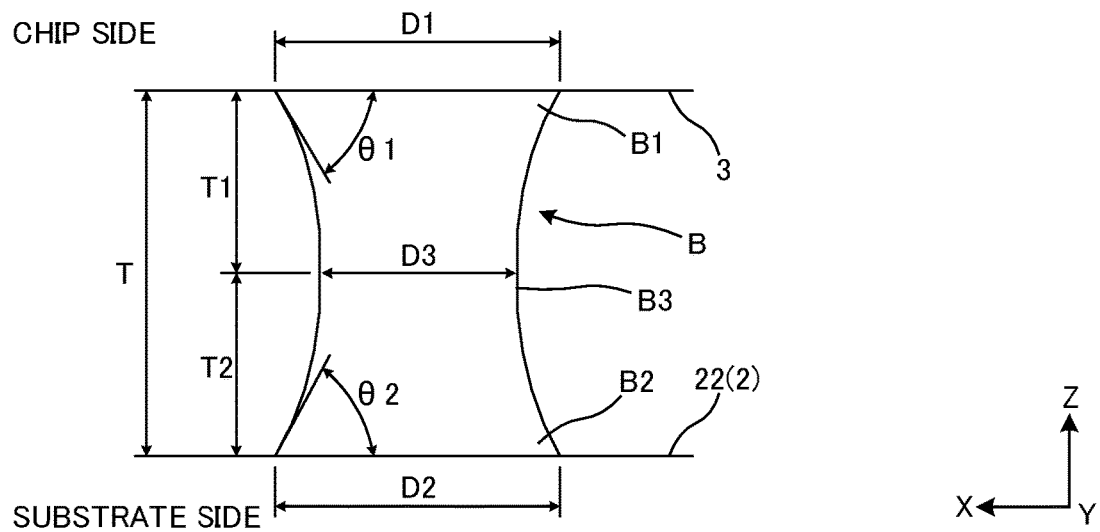
FIG. 11A and FIG. 11B are schematic views showing variations of a bump shape according to the present embodiment.

Here, further detailed shape of the bump B will be described with reference to FIG. 11. FIG. 11 is schematic views showing variations in a bump shape according to the present embodiment. The cross section of the bump B, which is obtained by cutting in an x-y plane, has a substantially round shape. In addition, as described above, the bump B is formed in the shape of being constricted in the middle portion in the height direction in comparison with the bonding portions. More specifically, as shown in FIG. 11A, the bump B includes: a first bonding portion B1 that is bonded to a semiconductor device 3 side; a second bonding portion B2 that is connected to a laminated substrate 2 side; and a constricted portion B3 that is constricted between the first bonding portion B1 and the second bonding portion B2.

When it is assumed that the width (outer diameter) of the first bonding portion B1 is D1, the width (outer diameter) of the second bonding portion B2 is D2, and the width (outer diameter) of the constricted portion B3 is D3, the relation of D1=D2>D3 is established. That is, the outer diameter D1 of the first bonding portion B1 and the outer diameter D2 of the second bonding portion B2 are equal, and the outer diameter D3 of the constricted portion B3 is smaller than the outer diameters D1 and D2. In addition, when it is assumed that the height of the bump B (facing distance between the semiconductor device 3 and the laminated substrate 2) is T, a distance between the constricted portion B3 and the semiconductor device 3 (electrode) is T1, and a distance between the constricted portion B3 and the laminated substrate 2 (circuit pattern 22) is T2, the relation of T=T1+T2, T1=T2 is established. That is, the constricted portion B3 is located at the center in the height direction of the bump B (center portion between the first bonding portion B1 and the second bonding portion B2).

An outer surface of the first bonding portion B1 is formed in a fillet shape making an angle $\theta 1$ acute between the fillet shape and a bonding surface of the semiconductor device 3 (electrode). Similarly, an outer surface of the second bonding portion B2 is formed in a fillet shape making an angle $\theta 2$ acute between the fillet shape and a bonding surface of the laminated substrate 2 (circuit pattern 22). In FIG. 11A, the relation of $\theta 1 = \theta 2$ is established. That is, an angle $\theta 1$ and an angle $\theta$ are equal.

As described above, the outer surfaces of the first bonding portion B1 and the second bonding portion B2 are formed in a fillet shape, thereby allowing the interface of a bonding portion of the bump B to be smoothly bonded to a corresponding electrode or circuit pattern 22. As a result, thermal stress applied to the vicinity of the interface is dispersed, which can make the bump B difficult to rupture.

Figure 11B:
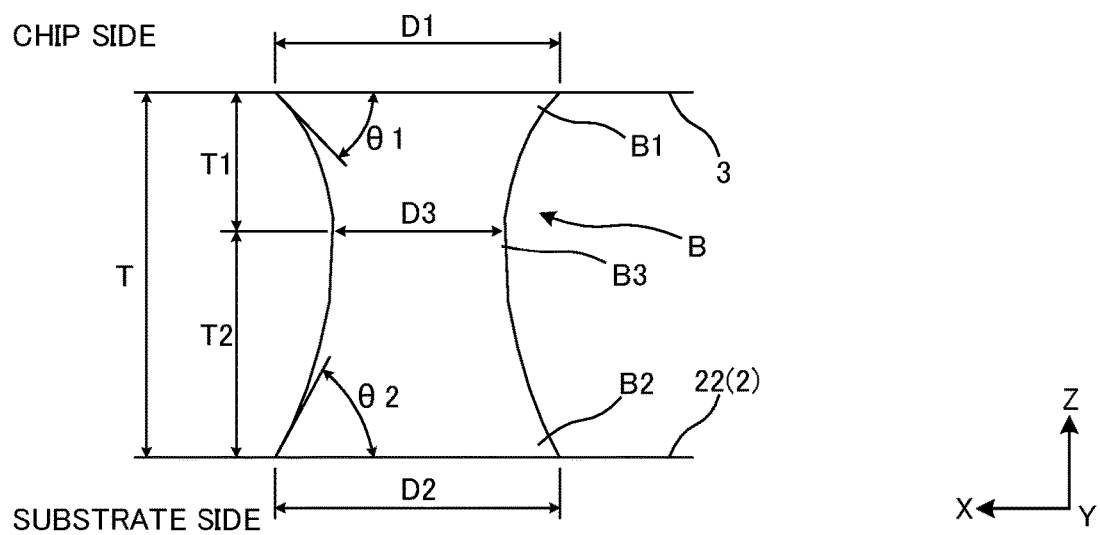

Note that although FIG. 11A shows a configuration where the constricted portion B3 is located in the center portion in the bump B height direction, this configuration is not limited thereto and can be modified as appropriate. For example, as shown in FIG. 11B, the constricted portion B3 may be arranged closer to the semiconductor device 3 side (T1<T2). In this case, an angle $\theta 1$ formed between the fillet shape of the first bonding portion B1 and a bonding surface to the semiconductor device 3 is smaller than an angle $\theta 2$ formed between the fillet shape of the second bonding portion B2 and a bonding surface to the laminated substrate 2 ($\theta 1 < \theta 2$). According to this configuration, heat is generated on the emitter electrode 32 of the semiconductor device 3 and therefore, by making the angle $\theta 1$ on the semiconductor device 3 side smaller, the dispersion effect of thermal stress can be further enhanced.

In addition, in FIG. 4B, the emitter electrode 32 is positioned on an outer side of the laminated substrate 2 than the gate electrode 31. According to this configuration, the emitter electrodes 32 that are heat generation locations are not concentrated on the center side of the module and spacing between the emitter electrodes 32 is allowed. As a result, heat is dispersed without being concentrated on the center of the module, thereby allowing cooling efficiency to be enhanced.

In addition, for one emitter electrode 32, a plurality of the bumps B (three in the present embodiment) are provided. That is, the emitter electrode 32 is bonded to its corresponding circuit pattern 22 via the plurality of bumps B. According to this configuration, since the heat of the semiconductor device 3 is generated mainly by the emitter electrode 32 as described above, arrangement of the plurality of bumps B on the emitter electrode 32 allows a further improvement in the heat dischargeability (cooling performance) through these bumps B. Furthermore, the plurality of bumps B are arranged in a row on the emitter electrode 32 and thereby, the dispersion effect of thermal stress can be further enhanced in comparison with a case where a single bump B is arranged.

In addition, the emitter electrode 32 is positioned closer to a side of either of the pair of projecting portions 45 than the gate electrode 31. Furthermore, the plurality of bumps B are arranged in a row along the extending direction (Y direction) of the pair of projecting portions 45. According to this configuration, the plurality of bumps B can be arranged closer to either of the projecting portions 45. Since the projecting portions 45 (collector electrode block 40) are formed of a lump of metal having good thermal conductivity, arrangement of the bumps B closer to the projecting portion 45 allows a further improvement in the heat dischargeability described above.

Figure 7A:
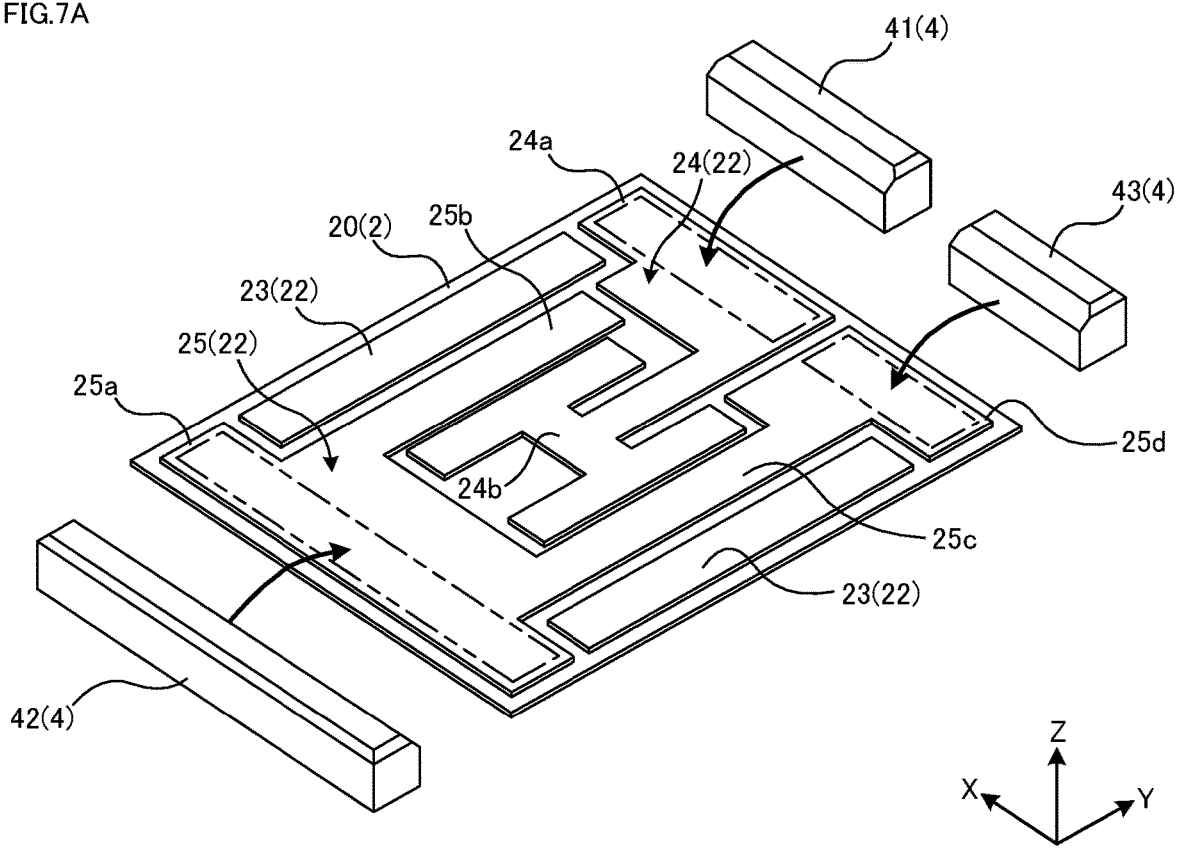
FIG. 7A and FIG. 7B are perspective views showing one example of a step of the semiconductor module manufacturing method according the present embodiment.
Figure 7B:
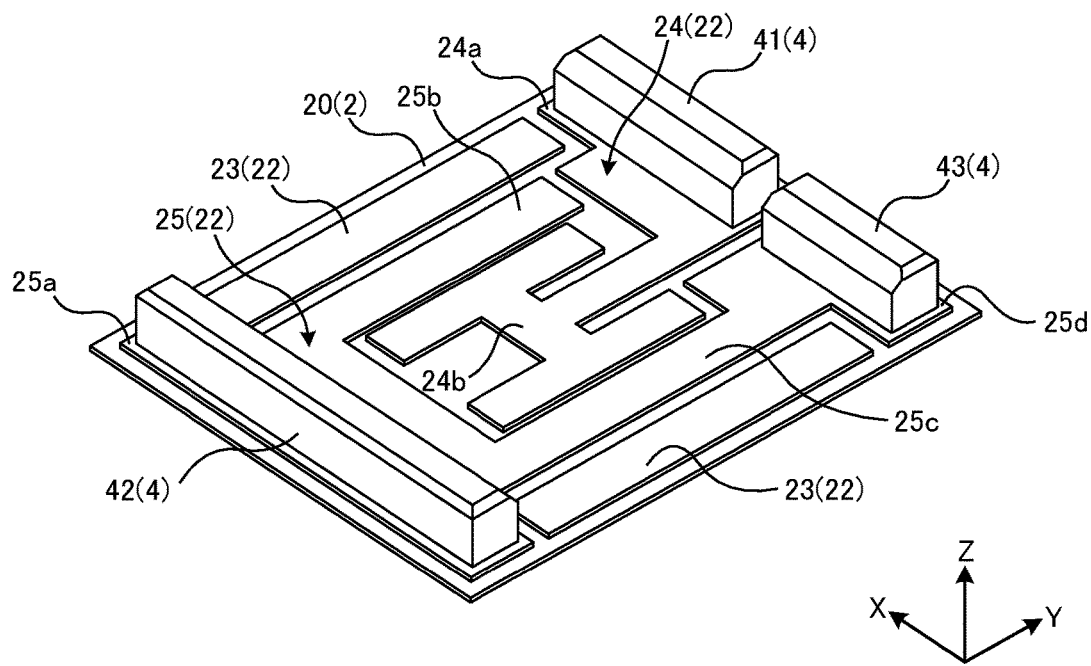
Figure 8A:
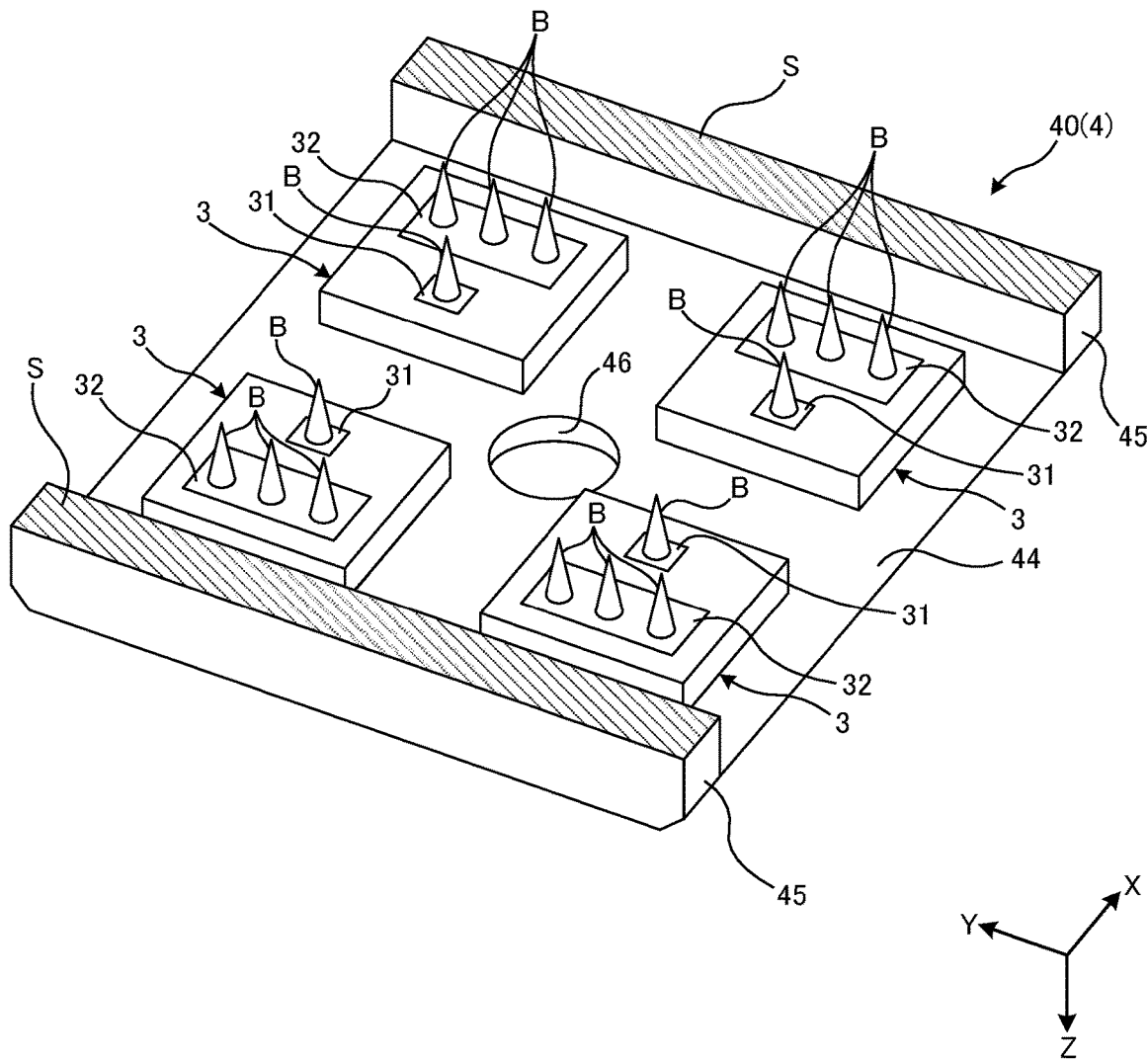
FIG. 8A and FIG. 8B are a perspective view and cross-sectional view showing one example of a step of the semiconductor module manufacturing method according the present embodiment.
Figure 8B:
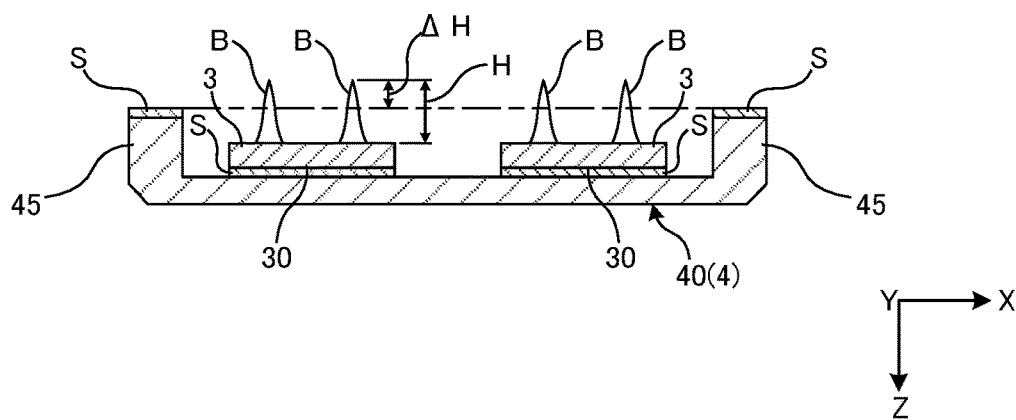

Next, a semiconductor module manufacturing method according to one aspect of the present embodiment will be described with reference to FIG. 6 to FIG. 10. FIG. 6 to FIG. 10 are perspective views each showing one example of a step of the semiconductor module manufacturing method according the present embodiment. Note that the semiconductor module manufacturing method presented below is merely an example and can be modified as appropriate without being limited to this configuration. In the following figures, the heat dissipating plate will be omitted for convenience of description. In addition, Figures A and B of FIGS. 6, 7, 9, and 10 show states before and after each step. Furthermore, FIG. 8A is a perspective view of a bump application step; and FIG. 8B is a schematic cross-sectional view of FIG. 8A.

A method for manufacturing the semiconductor module 1 according to the present embodiment includes the following steps which are performed in the given order: a preparation step of preparing a laminated substrate 2 and block electrodes 4; a chip arrangement step of arranging semiconductor devices 3 on a collector electrode block 40 (see FIG. 6); a block electrode arrangement step of arranging a gate electrode block 41, an emitter electrode block 42, and a sense emitter electrode block 43 on the laminated substrate 2 (see FIG. 7); a bump application step of arranging bumps on the semiconductor devices 3 (see FIG. 8); a bump bonding step of bonding the semiconductor devices 3 to which the bumps have been applied, to the laminated substrate 2 (see FIGS. 9 and 10); and a sealing step of filling a sealing resin 5 (see FIG. 1). Note that the order of those steps can be changed as appropriate unless any contradiction occurs.

First, the laminated substrate 2 and the block electrodes 4 (collector electrode block 40, gate electrode block 41, emitter electrode block 42, and sense emitter electrode block 43) which are described above are prepared in advance (preparation step).

Figure 6A:
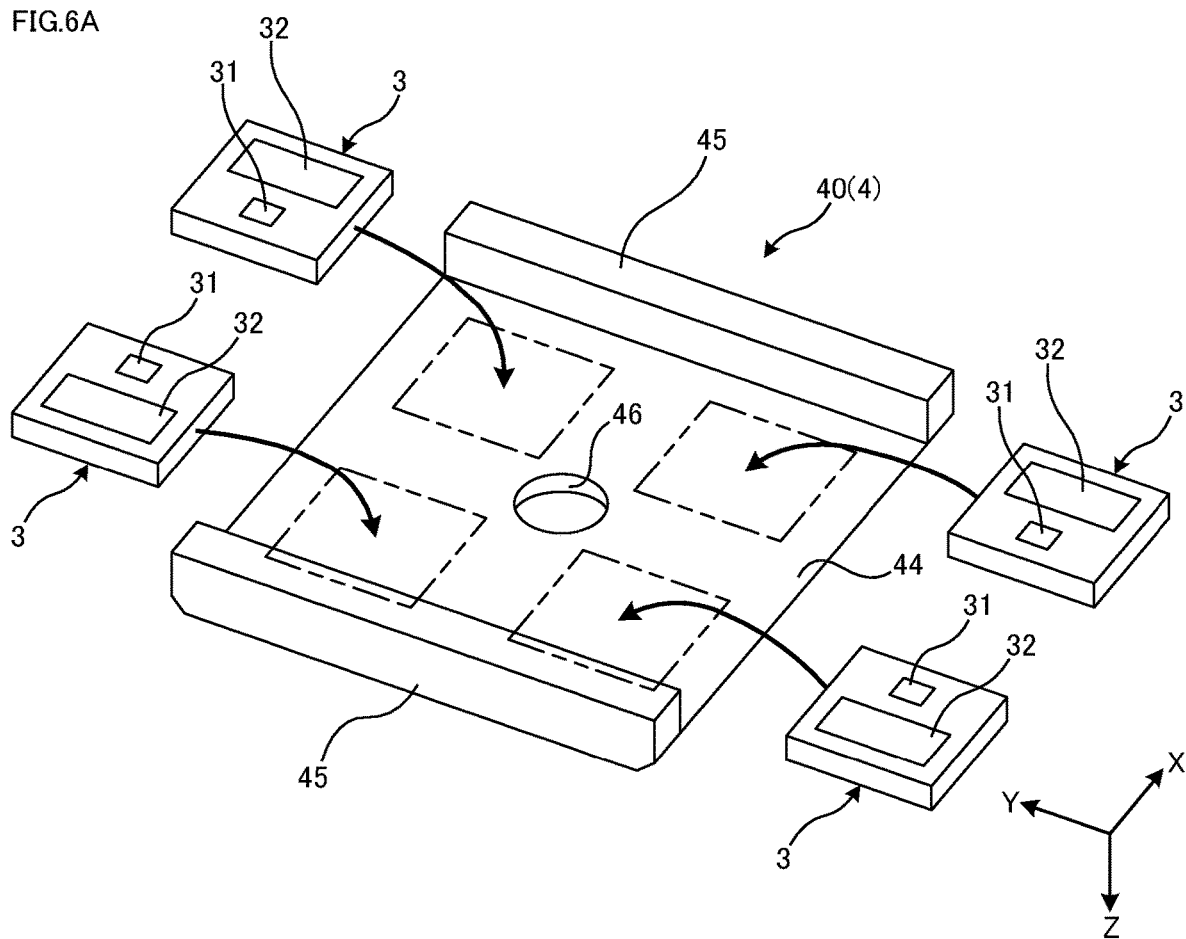
FIG. 6A and FIG. 6B are perspective views showing one example of a step of a semiconductor module manufacturing method according the present embodiment.
Figure 6B:
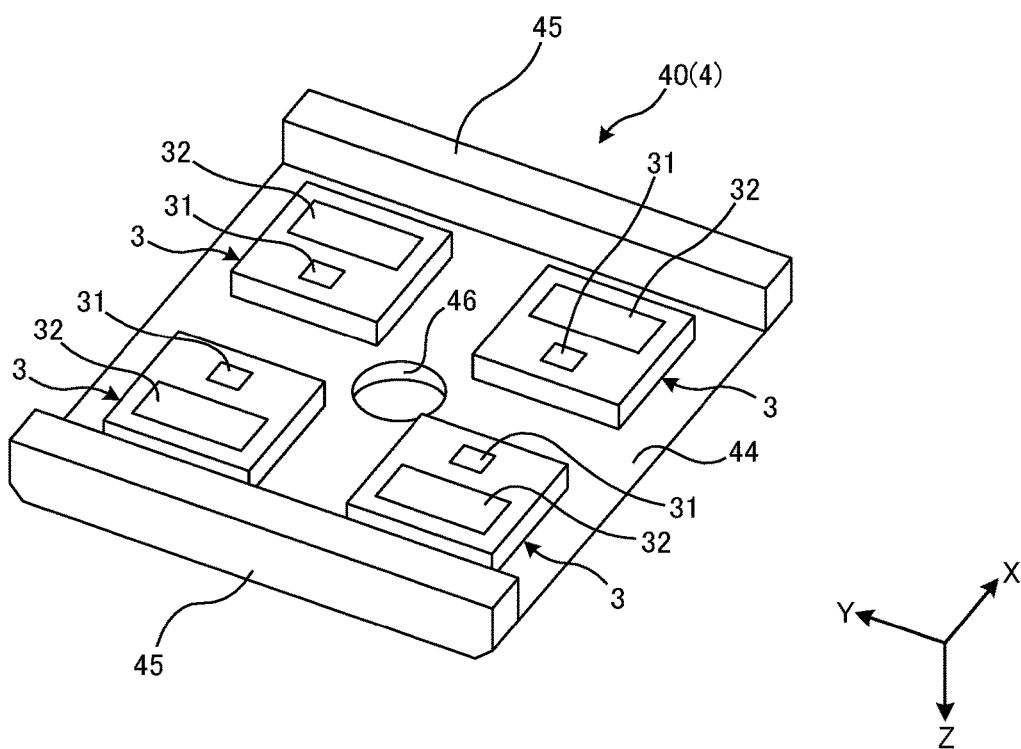

Next, the chip arrangement step is performed. As shown in FIG. 6A and FIG. 6B, in the chip arrangement step, four semiconductor devices 3 are arranged with collector electrodes 30 faced to a lower surface of the flat plate portion 44. On an upper surface (collector surface) of each of the semiconductor devices 3, a bonding material S (see FIG. 4) is placed, and the arrangement is performed at predetermined positions of the flat plate portion 44. In this case, a gate electrode 31 of each of the semiconductor devices 3 is arranged inward in the X direction relative to an emitter electrode 32. Then, the collector surfaces of the semiconductor devices 3 are pressed against the flat plate portion 44 at a predetermined pressure and are heated at a predetermined temperature for a predetermined time, and thereby the semiconductor devices 3 and the flat plate portion 44 are electrically bonded via the bonding material S. Note that as the bonding material S, one that is formed in advance in a sheet-like shape matched with the shape of the semiconductor devices 3 may be used; alternatively, a paste-like metal sintered material or the like may be applied to the collector surfaces.

Next, the first block electrode arrangement step is performed. As shown in FIG. 7A and FIG. 7B, in the first block electrode arrangement step, the gate electrode block 41, the emitter electrode block 42, and the sense emitter electrode block 43 are arranged at predetermined positions on the circuit patterns 22. Specifically, the gate electrode block 41 is arranged on an upper surface of the L portion 24a via the bonding material S. The emitter electrode block 42 is arranged on an upper surface of the emitter portion 25a via the bonding material S. The sense emitter electrode block 43 is arranged on an upper surface of the sense emitter portion 25a via the bonding material S. Then, these block electrodes 4 are pressed against the laminated substrate 2 at a predetermined pressure and are heated at a predetermined temperature for a predetermined time and thereby, the circuit patterns 22 and the block electrodes 4 except the collector electrode block 40 are electrically bonded via the bonding material S.

Next, the bump application step is performed. As shown in FIG. 8A, in the bump application step, bumps B of predetermined height are arranged on the emitter electrodes 32 and the gate electrodes 31. In addition, the bonding material S is placed on the lower surfaces of the pair of projecting portions 45. Note that the bumps B preferably have such a height that the bumps B project slightly more than lower surfaces of the bonding material S.

More specifically, each of the bumps B is applied so that its tip end is formed into a tapered cone shape. As described above, for the bumps B, a paste-like metal sintered material having a predetermined viscosity is used. The metal sintered material preferably has a viscosity that allows the bumps B after application to be maintained in a cone shape, that is, a viscosity that allows the shape consistency of the bumps B to be maintained. In other words, such a viscosity as causing the bumps B after application to flow is not preferable.

In addition, as shown in FIG. 8B, the bumps B are applied so that their tip ends project more than end faces of the pair of projecting portions 45 (end faces of the bonding material S). That is, the application height H of the bumps B (cone height) is such that the height of projection from the end faces of the bonding material S is ΔH. Note that the application height H of the bumps B is 0.3 mm or more and 3.0 mm or less. Preferably, it is 0.6 mm or more and 1.5 mm or less. The outer diameter of a bottom surface of each of the bumps B (the maximum diameter of the cone) is 50% or more and 90% or less of the application height H. Preferably, it is 60% or more and 80% or less. By adjusting the application height H and bottom surface outer diameter of the bumps B, the constricted shape of the bumps B, which is described later, can be controlled.

As described above, on each of the emitter electrodes 32, a plurality of the bumps B are arranged in a row. In the present embodiment, the bumps B are composed of a paste-like metal sintered material and this minimizes a distance between the bumps B, thereby enabling proximity arrangement. Although the details will be described later, the metal sintered material has the shape consistency in which it does not melt even by being heated and therefore, adjacent bumps B do not contact each other and thus, conduction between the semiconductor devices 3 and the laminated substrate 2 can be ensured. As a result, the emitter electrodes 32 can be made smaller, thereby achieving miniaturization of the entire module.

Figure 9A:
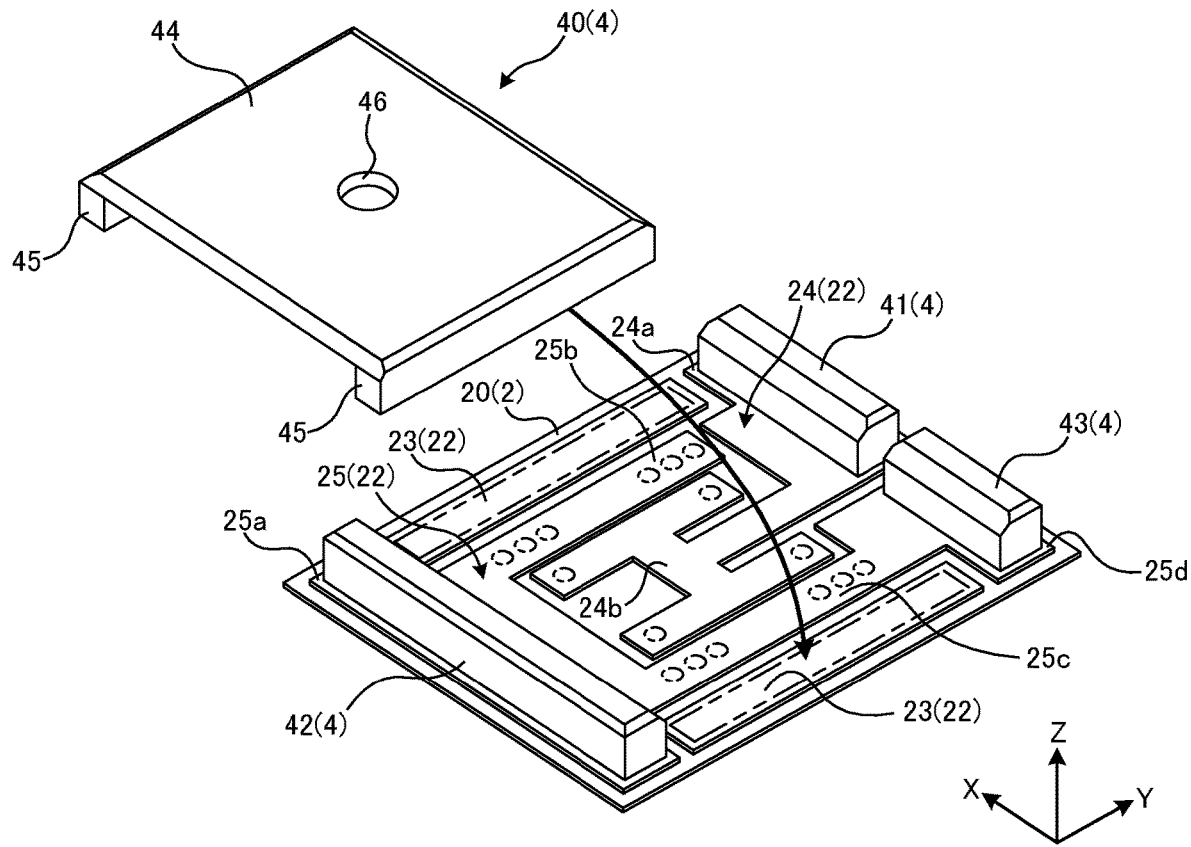
FIG. 9A and FIG. 9B are perspective views showing one example of a step of the semiconductor module manufacturing method according the present embodiment.
Figure 9B:
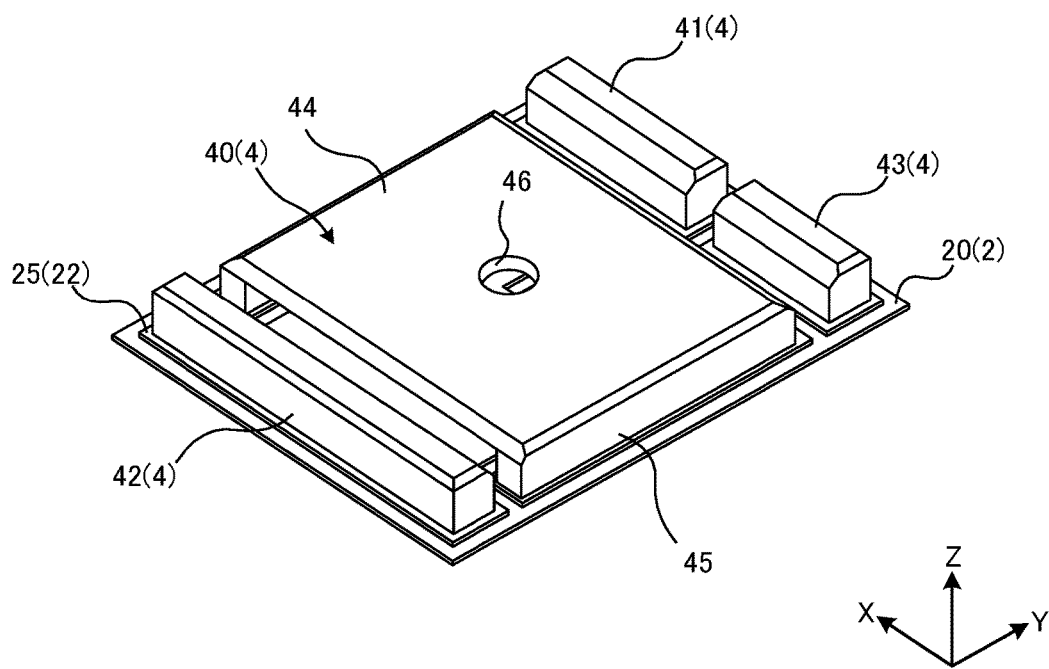

Next, the bump bonding step is performed. As shown in FIG. 9A and FIG. 9B, in the bump bonding step, the emitter electrodes 32 are bonded to a corresponding circuit pattern 22 via bumps B and the pair of projecting portions 45 is bonded to corresponding circuit patterns 22 via the bonding material S. Specifically, the bumps B placed on the emitter electrodes 32 are positioned on upper surfaces of the pair of the long portions 25b and 25c; and the bumps B placed on the gate electrodes 31 are positioned on an upper surface of the H portion 24b. In addition, the pair of projecting portions 45 is arranged on upper surfaces of the pair of collector circuit patterns 23 via the bonding material S.

Figure 10A:
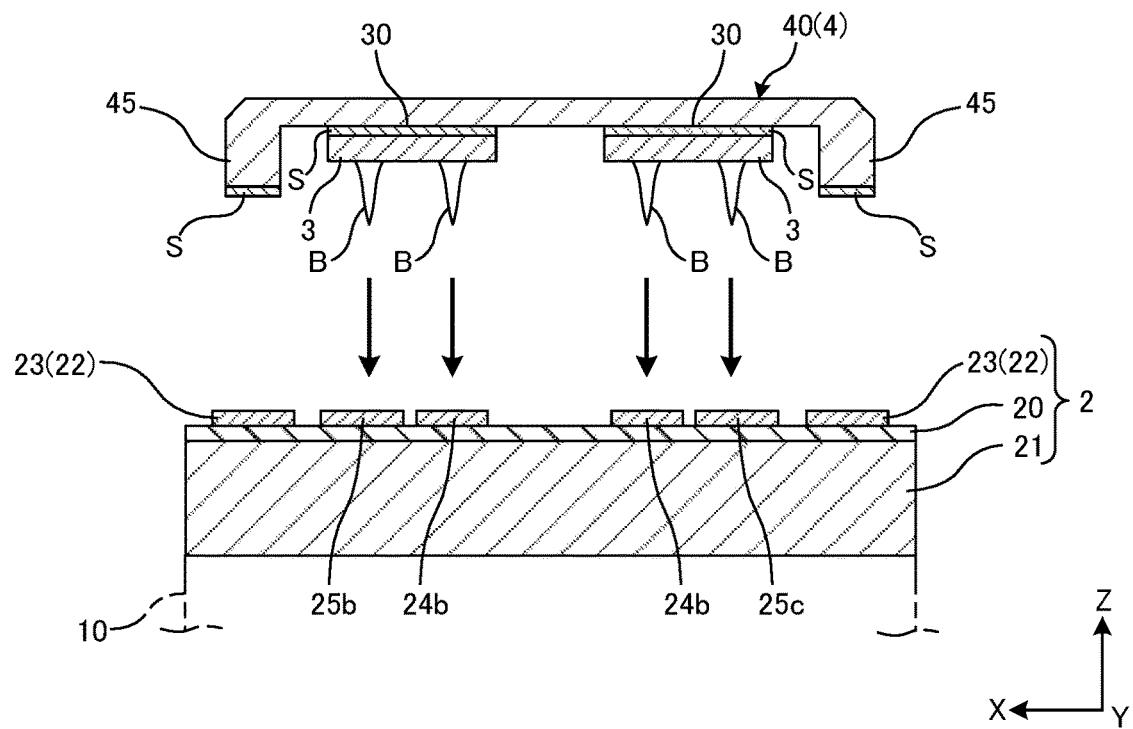
FIG. 10A and FIG. 10B are cross-sectional views showing one example of a step of the semiconductor module manufacturing method according the present embodiment.
Figure 10B:
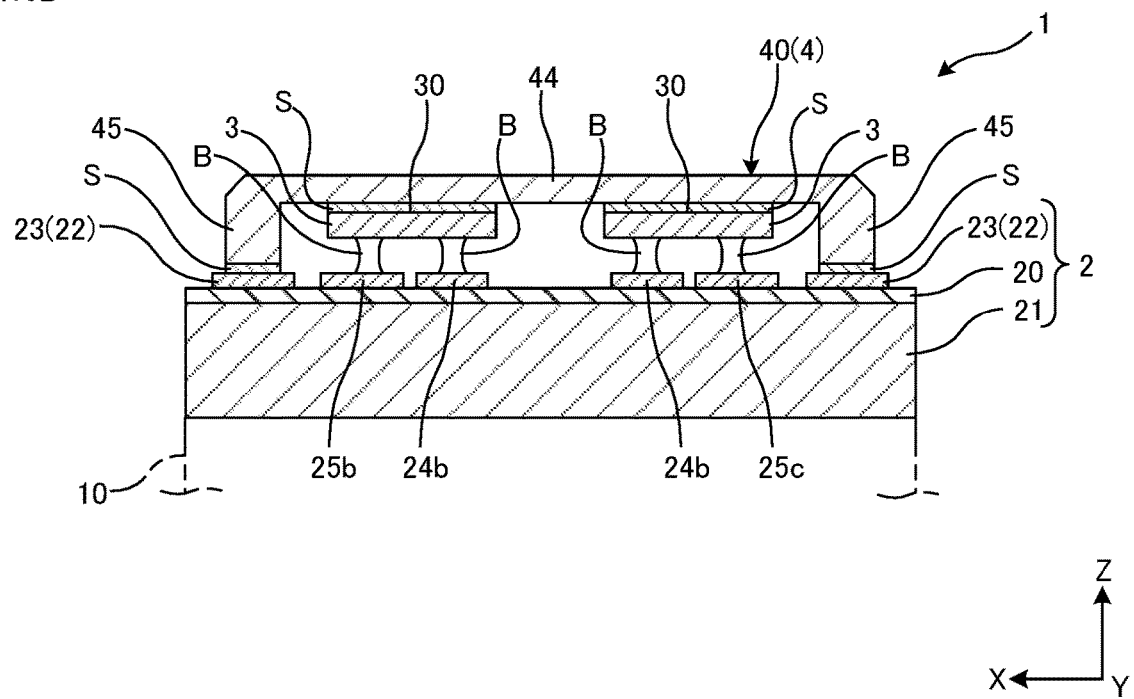

More specifically, as shown in FIG. 10A, a tip end of each of the bumps B is faced toward a side of the laminated substrate 2 and the tip end of each of the bumps B is pressed against a predetermined circuit pattern 22 that is a bonding target. The tip end of each of the bumps B is pressed until the pair of projecting portions 45 comes into contact with (is bonded to) the circuit pattern 22 via the bonding material S. As a result, the tip ends of the bumps B extend outward on a surface of the circuit pattern 22, forming a wide shape (see FIG. 10B). Then, each of the bumps B is formed into a drum shape with its middle portion constricted, as shown in FIG. 11.

That is, the shapes of the first bonding portion B1 and one part of the constricted portion B3 in the shape of the bump B shown in FIG. 11 are formed in advance in the bump application step shown in FIG. 8. After that, the tip end of the bump B is slightly crushed in the bump bonding step, thereby forming the shapes of the second bonding portion B2 and the other part of the constricted portion B3. Note that the bonding height T of the bump B is 20% or more and 55% or less of the application height H of the bump B. Preferably, it is 25% or more and 40% or less. If it is too much, the second bonding portion B2 does not extend and the bump B may be broken in the vicinity of the second bonding portion B2. If it is too less, the second bonding portion B2 side extends too much and the bump B may be broken in the vicinity of the first bonding portion B1.

In this case, the pair of projecting portions 45 serves to regulate the bonding height T of the bump B and control the opposing shape of the bump B. That is, the bonding height T of the bump B and the drum shape of the bump B can be adjusted according to the height of the pair of projecting portions 45. Note that the height of the pair of projecting portions 45 is preferably set within a range which is obtained by adding the bonding height T of the bump B to the thickness of the semiconductor devices 3.

Thus, in the present embodiment, the constricted portion B3 is formed in the middle portion of the bump B, through the utilization of the viscosity of metal, by pressing the tip end of the bump B applied in a cone shape against a corresponding circuit pattern 22 according to the height of the pair of projecting portions 45. This allows the bump B to be bonded to the circuit pattern 22 with a simple step.

In addition, in the bump bonding step, the tip end of the bump B is pressed against a corresponding circuit pattern 22 to form the constricted portion B3 in the middle portion of the bump B and then, the bump B is heated to be hardened. Specifically, the collector electrode block 40 is pressurized against the laminated substrate 2 at a predetermined pressure and is heated for a predetermined time at a predetermined temperature; and thereby, the emitter electrodes 32 are bonded to their corresponding circuit pattern 22 via bumps B and the collector electrode block 40 is bonded to the collector circuit patterns 23 via the bonding material S. Note that after heating, the bumps B slightly contract even while maintaining its entire outer shape but do not melt, exhibiting invariable shape consistency. As a result, adjacent bumps B do not come into contact with each other.

Next, the sealing step is performed. As shown in FIG. 1, in the sealing step, a space above the laminated substrate 2 is sealed by the sealing resin 5. For example, a rectangular frame body (not illustrated) is arranged around the laminated substrate 2 and a space within the frame body can be uniformly filled with the sealing resin 5 from the through hole 46. The sealing resin 5 is hardened, thereby sealing the laminated substrate 2, the semiconductor devices 3, and the block electrodes 4. Thus, the integrated semiconductor module 1 is completed.

As described above, according to the present invention, a bonding direction of the semiconductor device 3 is reversed from conventional one and the emitter electrode 32 is arranged toward a side of the laminated substrate 2, thereby allowing a reduction in thermal resistance and a reduction in inductance. In addition, the configurations of wire and the like can be omitted in comparison with a prior art, allowing simplification and miniaturization of the configuration of the entire module. Furthermore, the paste-like metal sintered material is applied in a cone shape to form a bump B, whose tip end is pressed against a bonding surface to form the bump B into a drum shape, thereby allowing a reduction in a bump distortion due to thermal stress and increasing the reliability of the apparatus in a simple configuration.

In the above embodiment, the number and arrangement positions of the semiconductor devices 3 are not limited to the above configuration, and can be changed as appropriate.

In the above embodiment, the number and layout of the circuit patterns 22 are not limited to the above configuration, and can be changed as appropriate.

In the above embodiment, the laminated substrate 2 and the semiconductor devices 3 are formed in a rectangular shape or square shape in a plan view, however, this configuration is not limited thereto. The laminated substrate 2 and the semiconductor devices 3 may be formed into a polygonal shape other than the above.

Furthermore, in the above embodiment, description has been made regarding a case where a cross section obtained by cutting a bump B in an X-Y plane has a substantially round shape; however, this configuration is not limited thereto. The cross-sectional shape of the bump B can be changed as appropriate, for example to a polygonal shape such as a quadrangle, or a star shape. In addition, the number of arrangements of the bump B for each electrode of the semiconductor devices 3 is not limited to the above example and can be changed as appropriate.

In the above embodiment, description has been made regarding a case where cone-shaped bumps B are formed on the semiconductor device 3 side in the bump application step; however, this configuration is not limited thereto. In the bump application step, cone-shaped bumps B may be formed on the side of a corresponding circuit pattern 22.

Although the present embodiment and modifications have been described, the above-described embodiment and modifications may be combined in whole or in part as another embodiment.

The present embodiment is not limited to the above embodiment and modifications, and various changes, substitutions, and alterations may be made without departing from the spirit of the technical idea. Furthermore, if the technical idea can be implemented in other ways by technical advances or other techniques derived, the method may be used. Therefore, the claims cover all embodiments that can be included within the scope of the technical idea.

The characteristic points of the above embodiment will be described in summary below.

The semiconductor module described in the above embodiment is characterized by including: a laminated substrate including a circuit pattern arranged on an upper surface of an insulating plate and a heat dissipating plate arranged on a lower surface of the insulating plate; and a semiconductor device that has a collector electrode arranged on an upper surface thereof, has an emitter electrode and a gate electrode arranged on a lower surface thereof, and has the emitter electrode and the gate electrode each bonded to an upper surface of the circuit pattern via a bump. The bump is made of a metal sintered material such that the bump is formed into a shape of being constricted in its middle portion in comparison with a bonding portion.

The above semiconductor module is further characterized in that the bump includes a first bonding portion bonded to a side of the semiconductor device, a second bonding portion connected to a side of the laminated substrate, and a constricted portion constricted between the first bonding portion and the second bonding portion, and the first bonding portion and the second bonding portion have a fillet shape making an angle acute between the fillet shape and a bonding surface.

The above semiconductor module is further characterized in that the constricted portion is positioned in a center portion between the first bonding portion and the second bonding portion.

The above semiconductor module is further characterized in that the constricted portion is positioned closer to the semiconductor device side.

The above semiconductor module is further characterized in that an angle formed between the fillet shape of the first bonding portion and a bonding surface to the semiconductor device is smaller than an angle formed between the fillet shape of the second bonding portion and a bonding surface to the laminated substrate.

The above semiconductor module is further characterized in that the emitter electrode is positioned on an outer side of the laminated substrate than the gate electrode.

The above semiconductor module is further characterized in that a plurality of the bumps bonded to the emitter electrode are provided.

The above semiconductor module is further characterized in that a block electrode bonded to the collector electrode is further provided and the block electrode includes a flat plate portion that covers a part above the semiconductor device and a pair of projecting portions that project toward the circuit pattern from both ends of the flat plate portion and are bonded to the circuit pattern.

The above semiconductor module is further characterized in that the pair of projecting portions is arranged along two opposing sides of the insulating plate and the emitter electrode is positioned closer to either of the pair of projecting portions than the gate electrode.

The above semiconductor module is further characterized in that the emitter electrode is bonded to the circuit pattern by a plurality of the bumps and the plurality of bumps are arranged in a row along the extending direction of the pair of projecting portions.

The above semiconductor module is further characterized in that four semiconductor devices are provided in a 2×2 arrangement below the flat plate portion in a plan view, each having a gate electrode. The four gate electrodes of the four semiconductor devices are arranged so as to face one another in the center of the flat plate portion.

In addition, the semiconductor module manufacturing method described in the above embodiment is a semiconductor module manufacturing method in which a semiconductor device is bonded to a laminated substrate including a circuit pattern arranged on an upper surface of an insulating plate and a heat dissipating plate arranged on a lower surface of the insulating plate; and is characterized by performing: a bump application step in which a bump made of a paste-like metal sintered material is applied on a bonding surface of the semiconductor device so that a tip end of the bump is formed into a tapered cone shape; and a bump bonding step in which bonding is performed by pressing the tip end of the bump against the circuit pattern so as to form a constricted portion in a middle portion of the bump.

The semiconductor module manufacturing method described in the above embodiment is further characterized by: performing, before the bump application step, a chip arrangement step of arranging the semiconductor device on a block electrode that includes a flat plate portion covering a part above the semiconductor device and a pair of projecting portions projecting toward the circuit pattern from both ends of the flat plate portion; arranging the semiconductor device with a collector electrode directed to a lower surface of the flat plate portion in the chip arrangement step; and bonding the pair of projecting portions to the circuit pattern in the bump bonding step.

The semiconductor module manufacturing method described in the above embodiment is further characterized in that the bump is applied so that a tip end thereof projects more than end faces of the pair of projecting portions in the bump application step.

The semiconductor module manufacturing method described in the above embodiment is further characterized in that in the bump bonding step, the tip end of the bump is pressed against the circuit pattern to form a constricted portion in the middle portion of the bump and then, the bump is heated to be hardened.

INDUSTRIAL APPLICABILITY

As described above, the present invention has the effect of increasing the reliability of an apparatus by reducing a bump distortion due to thermal stress in a simple configuration; and is especially useful for a semiconductor module and a semiconductor module manufacturing method.

REFERENCE SIGNS LIST 1 semiconductor module
2 laminated substrate
3 semiconductor device
4 block electrode
5 sealing resin
10 cooler
10a fin
10b groove
20 insulating plate
21 heat dissipating plate
22 circuit pattern
23 collector circuit pattern
24 gate circuit pattern
24a L portion
24b H portion
25 emitter circuit pattern 25a emitter portion
25b long portion
25c long portion
25d sense emitter portion
30 collector electrode
31 gate electrode
32 emitter electrode
40 collector electrode block
41 gate electrode block
42 emitter electrode block
43 sense emitter electrode block
44 flat plate portion
45 projecting portion
46 through hole
B bump
B1 first bonding portion
B2 second bonding portion
B3 constricted portion
D1 outer diameter of first bonding portion
D2 outer diameter of second bonding portion
D3 outer diameter of third bonding portion
H bump application height
S bonding material
T bump bonding height
θ1 angle between first bonding portion and bonding surface
θ2 angle between second bonding portion and bonding surface

What is claimed is:

1. A semiconductor module, comprising:
    a laminated substrate including an insulating plate, a circuit pattern arranged on an upper surface of the insulating plate, and a heat dissipating plate arranged on a lower surface of the insulating plate opposite to the upper surface of the insulating plate; and
    a semiconductor device having an upper surface and a lower surface opposite to the upper surface and facing the circuit pattern, the semiconductor device including a collector electrode arranged on the upper surface thereof, and an emitter electrode and a gate electrode arranged on the lower surface thereof, the emitter electrode being positioned closer to a periphery of the laminated substrate than is the gate electrode in a plan view of the semiconductor module; and
    bumps respectively bonding the emitter electrode and the gate electrode to an upper surface of the circuit pattern, wherein
    each of the bumps consists of a sintered material containing metal particles and is constricted in a middle portion thereof in a thickness direction orthogonal to a surface of the insulating plate.

2. The semiconductor module according to claim 1, wherein said each of the bumps includes:
    a first bonding portion having a first bonding surface and a first side surface surrounding the first bonding surface, the semiconductor device being bonded to the first bonding surface;
    a second bonding portion having a second bonding surface and a second side surface surrounding the second bonding surface, the laminated substrate being bonded to the second bonding surface; and
    a constricted portion constricted between the first bonding portion and the second bonding portion, and
    wherein each of the first bonding portion and the second bonding portion has a fillet shape that has an acute angle respectively formed between the first bonding surface and the first side surface and between the second bonding surface and the second side surface.

3. The semiconductor module according to claim 2, wherein the constricted portion is positioned at a center between the first bonding portion and the second bonding portion in the thickness direction.

4. The semiconductor module according to claim 2, wherein the constricted portion is positioned closer to the semiconductor device in the thickness direction than is the laminated substrate.

5. The semiconductor module according to claim 4, wherein the acute angle formed between the first bonding surface and the first side surface of the first bonding portion is smaller than the acute angle formed between the second bonding surface and the second side surface of the second bonding portion.

6. The semiconductor module according to claim 1, wherein the bump bonding the emitter electrode to the upper surface of the circuit pattern is formed in plurality.

7. The semiconductor module according to claim 1, further comprising a block electrode bonded to the collector electrode, wherein
    the block electrode includes:
        a flat plate portion covering an area above the semiconductor device in a plan view of the semiconductor module; and
        a pair of projecting portions projecting toward the circuit pattern in the thickness direction from a respective one of both ends of the flat plate portion, and being bonded to the circuit pattern.

8. The semiconductor module according to claim 7, wherein:
    the pair of projecting portions extend along two opposing sides of the insulating plate; and
    the emitter electrode is positioned closer to either one of the pair of projecting portions than is the gate electrode.

9. The semiconductor module according to claim 8, wherein:
    the bump bonding the emitter electrode to the upper surface of the circuit pattern is formed in plurality,
    the plurality of bumps are arranged along extending directions of the pair of projecting portions.

10. The semiconductor module according to claim 7, wherein:
    the semiconductor device is formed in plurality that are four and are provided in a 2×2 arrangement below the flat plate portion in the plan view, and
    the gate electrode of each of the semiconductor devices is arranged so as to face one another at a center of the flat plate portion.

11. The semiconductor module according to claim 1, wherein each bump has one end that is in direct contact with the emitter electrode or the gate electrode and the other end that is in direct contact with the upper surface of the circuit pattern.

12. The semiconductor module according to claim 1, wherein the sintered material is comprised of metal particles having porosity.

13. The semiconductor module according to claim 1, wherein each of the bumps consists of the same material.

* * * * *